(12) United States Patent
Han et al.

(10) Patent No.: US 11,927,640 B2
(45) Date of Patent: Mar. 12, 2024

(54) METHOD FOR ACQUIRING INFORMATION ABOUT STATE OF BATTERY ON BASIS OF VOLTAGE CHANGE AMOUNT OF BATTERY DURING CHARGING, AND ELECTRONIC DEVICE FOR SUPPORTING SAME

(71) Applicant: Samsung Electronics Co., Ltd., Gyeonggi-do (KR)

(72) Inventors: Seongho Han, Gyeonggi-do (KR); Bookeun Oh, Gyeonggi-do (KR); Gilho Kim, Gyeonggi-do (KR); Junyoung Oh, Gyeonggi-do (KR); Sungun Wi, Gyeonggi-do (KR); Jaeyeon Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 623 days.

(21) Appl. No.: 16/973,117

(22) PCT Filed: Jun. 5, 2019

(86) PCT No.: PCT/KR2019/006812
§ 371 (c)(1),
(2) Date: Dec. 8, 2020

(87) PCT Pub. No.: WO2019/240426
PCT Pub. Date: Dec. 19, 2019

(65) Prior Publication Data
US 2021/0255246 A1    Aug. 19, 2021

(30) Foreign Application Priority Data

Jun. 11, 2018 (KR) .................... 10-2018-0066843

(51) Int. Cl.
*G01R 31/367* (2019.01)
*G01R 31/371* (2019.01)
(Continued)

(52) U.S. Cl.
CPC ........ *G01R 31/367* (2019.01); *G01R 31/371* (2019.01); *G01R 31/382* (2019.01); *G06N 20/00* (2019.01)

(58) Field of Classification Search
None
See application file for complete search history.

(56) References Cited

U.S. PATENT DOCUMENTS 10,401,433 B2  9/2019  Chow et al.
10,739,407 B2  8/2020  Sung
(Continued)

FOREIGN PATENT DOCUMENTS

JP    7-46711 A    2/1995
JP    2016-125882 A    7/2016
(Continued)

OTHER PUBLICATIONS

Korean Office Action dated Nov. 18, 2022.

*Primary Examiner* — Jas A Sanghera
(74) *Attorney, Agent, or Firm* — Cha & Reiter, LLC

(57) ABSTRACT

An electronic device according to various embodiments of the present invention includes: a memory which stores one or more mapping parameters that indicate the correlation between a voltage change amount and the state of health (SOH) of the battery; and a processor, wherein the processor can be set to: detect that an external device for charging the battery is connected to the electronic device; charge the battery by using a charging current supplied from the external device; decide on at least one mapping parameter among the one or more mapping parameters on the basis of at least the charging current; check the voltage change amount of the battery while the battery is being charged; and (Continued)

acquire the SOH of the battery at least partially on the basis of the at least one mapping parameter and the voltage change amount.

15 Claims, 25 Drawing Sheets

(51) Int. Cl.
*G01R 31/382* (2019.01)
*G06N 20/00* (2019.01)

(56) References Cited

U.S. PATENT DOCUMENTS

| | | | |
|---|---|---|---|
| 2001/0028238 A1 | 10/2001 | Nakamura et al. | |
| 2006/0232277 A1 | 10/2006 | Murakami et al. | |
| 2013/0166233 A1 | 6/2013 | Suh et al. | |
| 2014/0266060 A1* | 9/2014 | Ying | H02J 7/0048 |
| | | | 320/134 |
| 2015/0311736 A1* | 10/2015 | Park | H02J 7/0047 |
| | | | 320/103 |
| 2016/0003917 A1 | 1/2016 | You et al. | |
| 2016/0239759 A1 | 8/2016 | Sung | |
| 2021/0091583 A1* | 3/2021 | Kamijima | G01R 31/371 |

FOREIGN PATENT DOCUMENTS

| | | |
|---|---|---|
| KR | 2001-0082115 A | 8/2001 |
| KR | 10-1070339 B1 | 10/2011 |
| KR | 10-2013-0073802 A | 7/2013 |
| KR | 10-2013-0125141 A | 11/2013 |
| KR | 10-2016-0004077 A | 1/2016 |
| KR | 10-1619634 B1 | 6/2016 |
| KR | 10-2016-0090226 A | 7/2016 |
| KR | 10-2016-0101506 A | 8/2016 |
| KR | 10-1806705 B1 | 12/2017 |

* cited by examiner

| 0.0110 | 0.0360 | 0.0520 | 0.0680 | 0.0850 | 0.1050 | 0.1280 | 0.1555 | 0.1865 | 0.2240 | 0.2695 | ←431 |
|---|---|---|---|---|---|---|---|---|---|---|---|
| 0.0105 | 0.0400 | 0.0590 | 0.0710 | 0.0815 | 0.0935 | 0.1085 | 0.1255 | 0.1455 | 0.1675 | 0.1925 | ←433 |
| 0.0110 | 0.0400 | 0.0605 | 0.0725 | 0.0835 | 0.0970 | 0.1130 | 0.1320 | 0.1525 | 0.1755 | 0.2015 | ←435 |
| 0.0110 | 0.0395 | 0.0590 | 0.0710 | 0.0810 | 0.0940 | 0.1105 | 0.1295 | 0.1510 | 0.1755 | 0.2025 | |
| ⋮ | | | | | | | | | | | |
| 0.0110 | 0.0370 | 0.0530 | 0.0680 | 0.0840 | 0.1010 | 0.1205 | 0.1435 | 0.1710 | 0.2020 | 0.2380 | |
| 0.0100 | 0.0355 | 0.0520 | 0.0670 | 0.0825 | 0.0995 | 0.1195 | 0.1425 | 0.1700 | 0.2010 | 0.2380 | ←437 |

430

FIG.4C $$\begin{matrix} \overbrace{441} & \overbrace{443} & \overbrace{445} & \cdots & \overbrace{447} \\ \end{matrix}$$

$$\left[ \begin{matrix} 21.90211 & -67.8717 & 70.13108 & & -24.152 \\ 0.449049 & -2.25256 & 3.275499 & & -1.45359 \\ -6.6336 & 19.68406 & -18.6148 & & 5.820713 \\ -37.0839 & 112.0046 & -112.577 & & 37.68994 \\ -79.1843 & 241.3545 & -245.005 & & 82.87402 \\ -133.993 & 348.2308 & -354.356 & & 120.1631 \\ -99.0089 & 302.4106 & -307.654 & & 104.3024 \\ -94.4526 & 289.0466 & -294.613 & & 100.073 \\ -74.3391 & 227.72 & -232.28 & & 78.9572 \\ -90.4926 & 216.2047 & -220.762 & & 75.1112 \\ -59.0082 & 181.0618 & -184.902 & \cdots & 62.91381 \\ -61.0791 & 187.8049 & -192.172 & & 65.51675 \\ -55.2104 & 170.4757 & -175.112 & & 59.92144 \\ -48.0957 & 148.9852 & -153.445 & & 52.63502 \\ -33.3066 & 103.4937 & -106.77 & & 36.66675 \\ -25.7714 & 80.46228 & -83.2723 & & 28.67056 \\ -58.9833 & 182.522 & 187.752 & & 64.30764 \\ -10.7987 & 34.25075 & -35.6597 & & 12.30773 \\ -10.2694 & 32.87414 & -34.4544 & & 11.95543 \\ -10.9726 & 34.72288 & -35.9776 & & 12.33878 \\ -5.18707 & 16.63428 & -17.0747 & & 5.744813 \\ -1.47423 & 4.680899 & -4.21768 & & 1.134658 \\ \end{matrix} \right]$$

442 (top row), 444 (second row), 446 (bottom row)

440

FIG. 4D $$\Delta V \left| \begin{pmatrix} a_{01} & \cdots & a_{N1} \\ \vdots & \ddots & \vdots \\ a_{0k} & \cdots & a_{Nk} \end{pmatrix} \right.$$

SOH

450

FIG.4E $$\Delta V \left| \begin{pmatrix} \overline{a_{01}} & \cdots & \overline{a_{N1}} \\ \vdots & \ddots & \vdots \\ \overline{a_{0k}} & \cdots & \overline{a_{Nk}} \end{pmatrix} \right.$$

SOC

530

FIG.5C $$\Delta V_{OCV} \left| \begin{pmatrix} a_{01}^{\bullet} & \cdots & a_{N1}^{\bullet} \\ \vdots & \ddots & \vdots \\ a_{0k}^{\bullet} & \cdots & a_{Nk}^{\bullet} \end{pmatrix} \right.$$

SOH

$$\begin{pmatrix} b_{01} & \cdots & b_{N1} \\ \vdots & \ddots & \vdots \\ b_{0k} & \cdots & b_{Nk} \end{pmatrix}$$

METHOD FOR ACQUIRING INFORMATION ABOUT STATE OF BATTERY ON BASIS OF VOLTAGE CHANGE AMOUNT OF BATTERY DURING CHARGING, AND ELECTRONIC DEVICE FOR SUPPORTING SAME

CROSS REFERENCE TO RELATED APPLICATIONS

This application is a National Phase Entry of PCT International Application No. PCT/KR2019/006812, which was filed on Jun. 5, 2019, and claims a priority to Korean Patent Application No. 10-2018-0066843, which was filed on Jun. 11, 2018, the contents of which are incorporated herein by reference.

TECHNICAL FIELD

The disclosure relates to a method of obtaining information associated with the state of a battery based on a variation in voltage of the battery during charging, and an electronic device supporting the same.

BACKGROUND ART

The battery of an electronic device has characteristics of a relatively higher energy, a higher power density, and a lower cost than other energy storage devices, whereby the battery of the electronic device is widely used as a repeatedly chargeable energy storage device. As the number of times that the battery of the electronic device is charged or discharged increases, the capacity of the battery of the electronic device is gradually decreased (or the life of the battery of the electronic device gradually deteriorates). As the capacity of the battery of the electronic device is decreased, a safety issue such as swelling of a battery may occur. In order to prevent the problem, the capacity of the battery of the electronic device needs to be accurately calculated.

DISCLOSURE OF INVENTION

Technical Problem

Conventionally, the capacity of the battery of an electronic device is calculated by adding up the amount of current while the battery of the electronic device is being fully charged or discharged.

A user of the electronic device may start charging the battery in the state of the battery not being fully charged (or in the state of the battery being partially charged), rather than charging the battery in the state of the battery being fully charged, and may stop charging the battery before the battery of the electronic device becomes the fully charged.

Accordingly, there is a desire to accurately calculate the capacity of the battery of the electronic device in the case of charging the battery of the electronic device which is not in a fully discharged state and stopping charging when the battery is partially charged.

According to various embodiments, there are provided a method of obtaining information associated with the state of a battery based on a variation in voltage of the battery during charging, and an electronic device supporting the same, which may accurately calculate the capacity of the battery of the electronic device while the battery of the electronic device is partially charged.

The technical subject matter of the document is not limited to the above-mentioned technical subject matter, and other technical subject matters which are not mentioned may be understood by those skilled in the art based on the following description.

Solution to Problem

In accordance with an aspect of the disclosure, an electronic device may include a memory storing one or more mapping parameters indicating a correlation between a variation in voltage of the battery and the state of health (SOH) of the battery, and a processor, wherein the processor is configured to: detect that an external device for charging the battery is connected to the electronic device; charge the battery using a charging current supplied from the external device, and determine, based at least on the charging current, at least one mapping parameter among the one or more mapping parameters; identify a variation in voltage of the battery while charging the battery; and obtain an SOH of the battery based at least on the at least one mapping parameter and the variation in voltage.

In accordance with an aspect of the disclosure, a method of obtaining the state of a battery of an electronic device, based on a variation in voltage of the battery during charging, may include: detecting that an external device for charging the battery is connected to the electronic device; charging the battery using a charging current supplied from the external device; determining, based at least on the charging current, at least one mapping parameter among one or more mapping parameters stored in a memory; identifying a variation in voltage of the battery while charging the battery; and obtaining the state of health (SOH) of the battery based at least on the at least one mapping parameter and the variation in voltage.

ADVANTAGEOUS EFFECTS OF INVENTION

A method of providing information associated with the state of a battery and an electronic device supporting the same, according to various embodiments of the disclosure, can accurately calculate the capacity of the battery of the electronic device while the battery of the electronic device is being partially charged.

A method of obtaining information associated with the state of a battery based on a variation in voltage of the battery while the battery is being charged, and an electronic device supporting the same, according to various embodiments of the disclosure may periodically monitor the capacity of the battery of the electronic device, and if the capacity of the battery of the electronic device is changed greater than or equal to a designated threshold value, may enable a user or a manufacturer to recognize the same, and thus, the problem related to safety, such as swelling of a battery, may be prevented in advance.

A method of obtaining information associated with the state of a battery based on a variation in voltage of the battery while the battery is being charged, and an electronic device supporting the same according to various embodiments of the disclosure may accurately calculate the capacity of the battery of the electronic device by calculating the capacity of the electronic device in consideration of a charging environment (e.g., a function performed in the electronic device, a charging scheme used for charging the electronic device, the temperature of the electronic device, and the like) while the battery of the electronic device is being charged.

BRIEF DESCRIPTION OF DRAWINGS

FIGS. 4A to 4E are diagrams illustrating a method of calculating a mapping parameter indicating a relationship between a variation in output voltage of a battery and the SOH of the battery according to various embodiments of the disclosure;

FIGS. 5A to 5C are diagrams illustrating a method of calculating a mapping parameter indicating a relationship between a variation in output voltage of a battery and the SOC of the battery according to various embodiments of the disclosure;

FIG. 6 is a diagram illustrating a matrix including a mapping parameter as an element, the mapping parameter indicating a relationship between a variation in open circuit voltage of a battery and the SOH of the battery according to various embodiments of the disclosure;

FIG. 8 is a diagram illustrating a matrix including a temperature parameter as an element, the temperature parameter being used for obtaining a mapping parameter according to various embodiments of the disclosure;

BEST MODE FOR CARRYING OUT THE INVENTION

Figure 1:
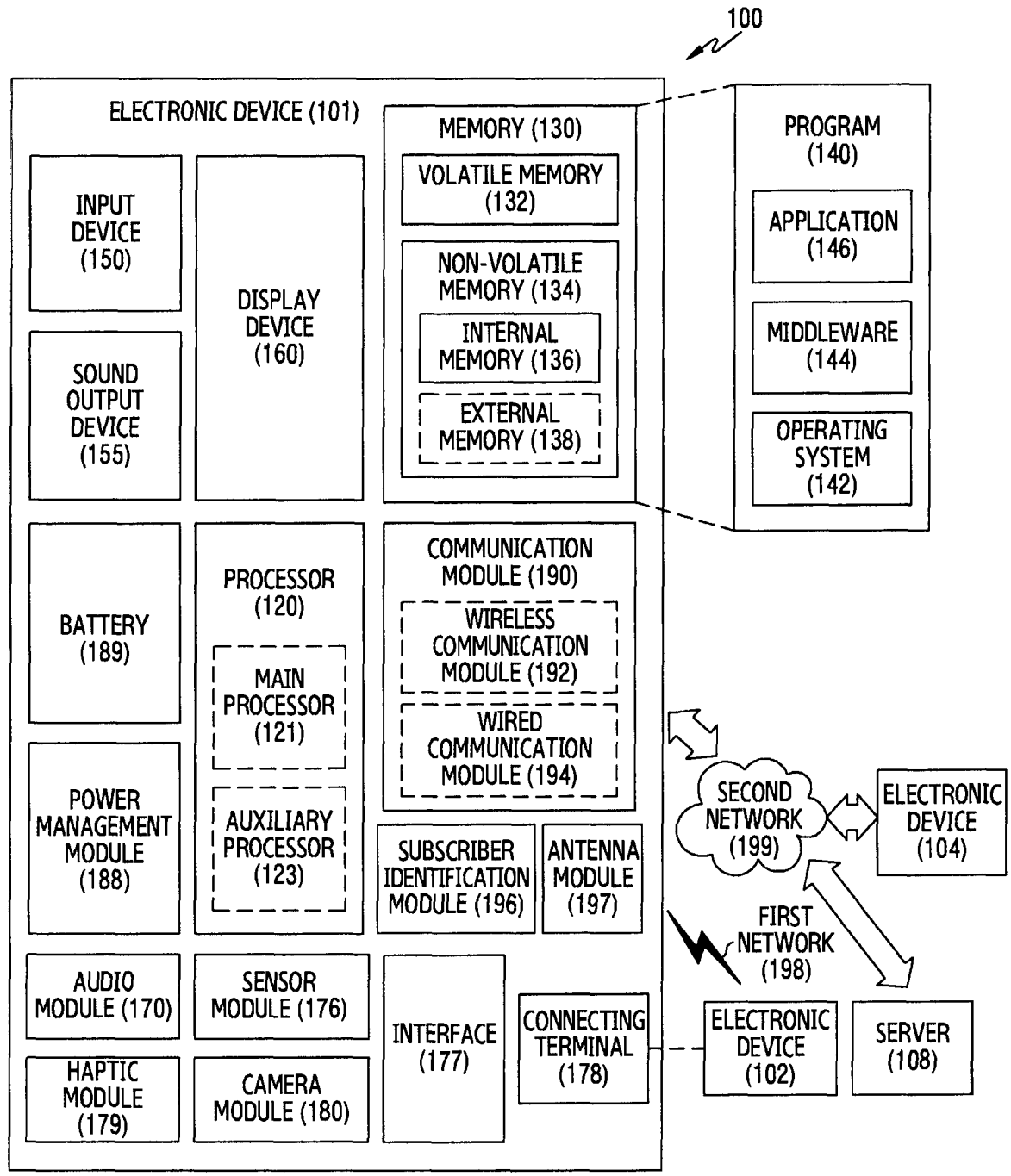
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
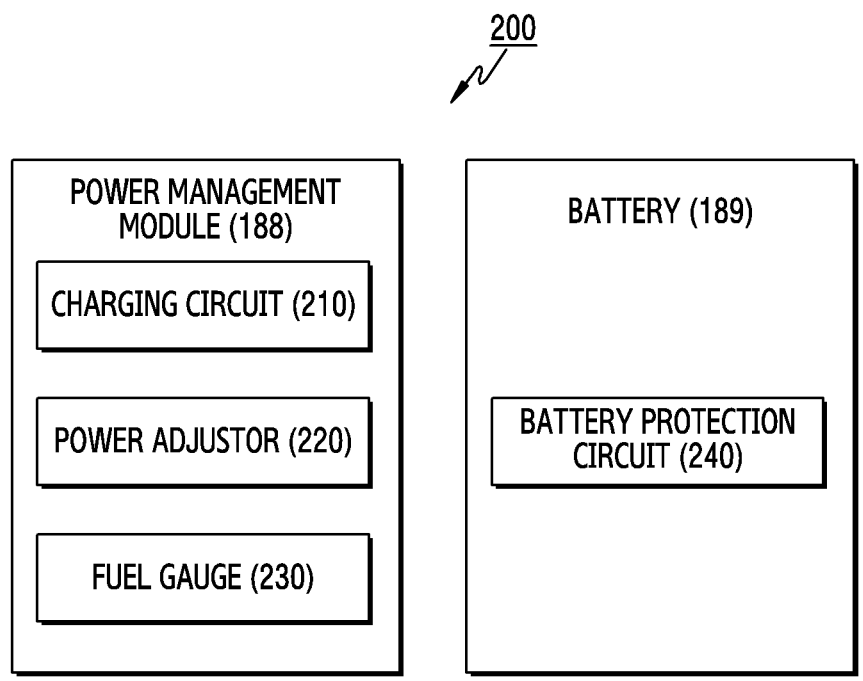
FIG. 2 is a diagram illustrating an electronic device for processing data according to various embodiments of the disclosure.

FIG. 2 is a block diagram 200 associated with the power management module 188 and the battery 189 according to various embodiments. Referring to FIG. 2, the power management module 188 may include a charging circuit 210, a power adjustor 220, or a fuel gauge 230. The charging circuit 210 may charge the battery 189 using power supplied from an external power of the electronic device 101. According to an embodiment, the charging circuit 210 may select a charging scheme (e.g., a normal charging or a fast charging) based at least partially on the type of an external power (e.g., a power adapter, a USB, or a wireless charger), the magnitude of power supportable from the external power (e.g., greater than or equal to approximately 20 W), or the attributes of the battery 189. The external power may be connected in a wired manner, for example, via the connection terminal 178, or may be connected in a wireless manner, for example, via the antenna module 197.

The power adjustor 220 may convert power to power having different voltage levels or different current levels by adjusting the voltage level or current level of the power supplied from the external power or the battery 189. The power adjustor 220 may adjust power of the external power or the battery 189 to a voltage level or a current level that is appropriate for each of the elements included in the electronic device 101. According to an embodiment, the power adjustor 220 may be implemented in the form of a low drop out (LDO) regulator or a switching regulator.

The fuel gauge 230 may measure the usage state information of the battery 189 (e.g., the capacity of the battery, the number of times that the battery is charged/discharged, a voltage, or a temperature).

The power management module 188 may determine charging state information related to charging of the battery 189 (e.g., life, overvoltage, low voltage, overcurrent, over charging, over discharging (over discharge), overheating, short circuit, or swelling) based at least partially on the measured usage state information, using, for example, the charging circuit 210, the voltage adjustor 220, or the fuel gauge 230, may determine whether the battery 189 is in the abnormal state or the normal state based at least partially on the determined charging state information, and may adjust charging of the battery 189 (e.g., decreasing a charging current or voltage, or stopping charging) if the battery 189 is identified as being in the abnormal state. According to an embodiment, at least some functions of the power management module 188 may be performed by an external control device (e.g., the processor 120).

The battery 189, according to an embodiment, may include a battery protection circuit (a battery protection circuit module (PCM)) 240. The battery protection circuit 240 may perform various functions (e.g., a previous blocking function) for preventing damage or deterioration in performance of the battery 189. The battery protection circuit 240 may be additionally or alternatively configured as at least a part of a battery management system (BMS) for performing cell balancing, measuring the capacity of the battery, measuring the number of times that charging/discharging is performed, measuring a temperature, or measuring a voltage.

According to an embodiment, at least a part of the usage state information or the charging state information of the battery 189 may be measured using the fuel gauge 230, the power management module 188, or a corresponding sensor (e.g., a temperature sensor) in the sensor module 176. In this instance, according to an embodiment, the corresponding sensor (e.g., a temperature sensor) in the sensor module 176 may be included as a part of the battery protection circuit 140, or may be prepared as a separate device and may be disposed near the battery 189.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
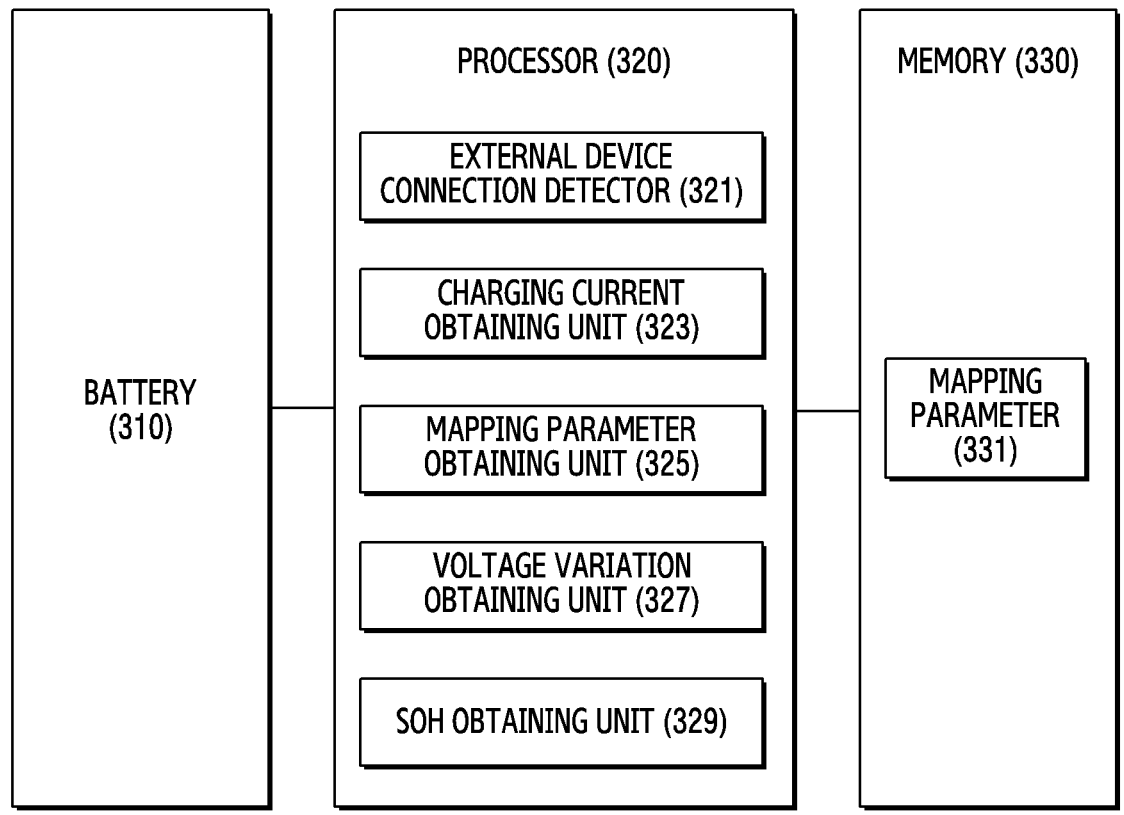
FIG. 3 is a block diagram illustrating an electronic device for providing information associated with the state of a battery according to various embodiments of the disclosure.

FIG. 3 is a block diagram illustrating the electronic device 101 for providing information associated with the state of a battery according to various embodiments of the disclosure.

According to an embodiment, the state of a battery may include the state of health (SOH) of the battery or the state of charging (SOC) of the battery.

According to an embodiment, the SOH of a battery may be a ratio of the current capacity of the battery to the capacity of the battery at the time of manufacture. The SOH of a battery may be referred to as the capacity of the battery (or the amount of charge remaining in the battery), life (or desired life or remaining life), performance, or the like.

According to an embodiment, the SOC of a battery may include the state of charging of the battery. The SOC of a battery may be referred to as the current amount of charge, the degree of charge, and the like in association with the battery 310.

Referring to FIG. 3, the electronic device 101 may include the battery 310, a processor 320, and a memory 330.

According to an embodiment, the battery 310 may include a secondary battery which is repeatedly chargeable (or rechargeable). For example, the battery 310 may include a lithium-ion battery. The battery 310 is not limited to a lithium-ion battery. According to an embodiment, the battery 310 may have a configuration, at least a part of which is the same as, or similar to, that of the battery 189 of FIG. 1.

According to an embodiment, the memory 330 may have a configuration, at least a part of which is the same as, or similar to, that of the memory 130 of FIG. 1. According to an embodiment, the memory 330 may include a mapping parameter 331.

According to an embodiment, the mapping parameter 331 may include a parameter (or a parameter set, a coefficient, or a function) indicating a correlation between a variation in voltage (or output voltage (or voltage level)) of a battery and the SOH (or SOC) of the battery. According to an embodiment, the mapping parameter 331 may be a parameter used for expressing a relationship between a voltage level that varies during a designated period of time and the SOH of the battery, in an equation.

According to an embodiment, the voltage of the battery related to the mapping parameter 331 (or the voltage of the battery for calculating the mapping parameter 331) may be a closed circuit voltage (or closed loop voltage) that takes into consideration the internal resistance (or the charging current) of the battery. According to an embodiment, the voltage of the battery related to the mapping parameter 331 may be an open circuit voltage (or an open loop voltage) that does not takes into consideration the internal resistance of the battery (or an open circuit voltage that is measured in the no-load state). Hereinafter, "battery voltage" refers to the closed circuit voltage of a battery and the open circuit voltage of a battery and "battery output voltage" refers to the closed circuit voltage of a battery.

According to an embodiment, if the mapping parameter 331 is configured as a mapping parameter indicating a correlation between a variation in closed circuit voltage of the battery and the SOH (or SOC) of the battery, the mapping parameters 331 may include mapping parameters that differ depending on a charging current (or charging C-rate). According to an embodiment, if the mapping parameter 331 is configured as a mapping parameter indicating a correlation between a variation in open circuit voltage of the battery and the SOH of the battery, the mapping parameter 331 may include a mapping parameter (or a single mapping parameter) which is independent from a charging current (or charging C-rate).

According to an embodiment, the mapping parameter 331 may be a parameter that varies (or reflects the ambient temperature of the electronic device 101) depending on the temperature of the electronic device 101 (e.g., the ambient temperature of the electronic device 101 or the internal temperature of the electronic device 101). According to an embodiment, the mapping parameter 331 may be calculated (or obtained) based on a battery life deterioration experiment performed under an accelerated condition (or environment). For example, the mapping parameter 331 may be calculated (or obtained) based on a battery life deterioration experiment performed in the condition of a temperature (approximately 45° C.) higher than room temperature (e.g., approximately 25° C.). According to an embodiment, in order to calculate a mapping parameter that varies according to the ambient temperature of the electronic device 101, the battery life deterioration experiment may be performed under at least two temperature conditions (e.g., approximately 25° C. and approximately 45° C).

A method of calculating the mapping parameter 331 stored in the memory 330 will be described in detail with reference to FIGS. 4 to 8.

According to an embodiment, the processor 320 may control overall operation for providing information associated with the state of the battery 310. According to an embodiment, the processor 320 may have a configuration, at least a part of which is the same as, or similar to, that of the processor 120 of FIG. 1. According to an embodiment, the processor 320 may have a configuration, at least a part of which is the same as, or similar to, that of the power management module 188 or PMIC of FIG. 2. According to an embodiment, the processor 320 may be included in the power management module 188 or the PMIC of FIG. 2. According to an embodiment, the processor 320 may have a configuration, at least a part of which is the same as, or similar to, that of the battery management system (BMS).

According to an embodiment, the processor 320 may include an external device connection detector 321, a charging current obtaining unit 323, a mapping parameter obtaining unit 325, a voltage variation obtaining unit 327, and an SOH obtaining unit 329.

According to an embodiment, the external device connection detector 321 may detect whether an external device (hereinafter, referred to as "external device") for charging a battery is connected to the electronic device 101. According to an embodiment, the external device connection detector 321 may detect whether an external device (e.g., a USB charging device, a travel adapter, an external battery, or an in-vehicle charging device) is connected to the electronic device 101 (e.g., a battery connector) in a wired manner. According to an embodiment, the external device connection detector 321 may detect whether an external device (e.g., a wireless charger, a wireless charging pad, a wireless charging cradle, or wireless charging case) for charging the battery 310 is connected in a wireless manner. In this instance, an external device for charging the battery 310 is not limited to the above-mentioned examples.

According to an embodiment, the charging current obtaining unit 323 may obtain information associated with a current (hereinafter, referred to as "charging current") supplied to the battery 310 via an external device. According to an embodiment, the charging current obtaining unit 323 may obtain the level (or magnitude) of a charging current. According to an embodiment, a charging current may be a constant current. According to an embodiment, the charging current obtaining unit 323 may obtain information associated with a charging current by measuring a charging current supplied from an external device to the battery 310. According to an embodiment, the charging current obtaining unit 323 may obtain information associated with a charging current, via communication with an external device.

According to an embodiment, the mapping parameter obtaining unit 325 may obtain the mapping parameter 331 from the memory 330.

According to an embodiment, if the mapping parameter 331 stored in the memory 330 is configured as a mapping parameter indicating the correlation between a variation in output voltage of a battery and the SOH (or SOC) of the battery, the mapping parameter obtaining unit 325 may obtain a mapping parameter that matches (or corresponds to) an obtained charging current from among mapping parameters stored for respective charging currents (or charging C-rates).

According to an embodiment, if the parameter 331 stored in the memory 330 is configured as a mapping parameter indicating a correlation between a variation in open circuit voltage of the battery and the SOH (or SOC) of the battery, the mapping parameter obtaining unit 325 may obtain, from the memory 330, a mapping parameter indicating a correlation between a variation in open circuit voltage of the battery and the SOH (or SOC) of the battery.

According to an embodiment, the mapping parameter obtaining unit 325 may obtain the mapping parameter 331 based at least partially on the temperature of the electronic device 101 which the electronic device 101 obtains using the sensor module 176 (e.g., a temperature sensor). For example, the mapping parameter obtaining unit 325 may obtain a mapping parameter by applying (or substituting) the obtained temperature of the electronic device 101 to a function indicating a relationship among a mapping parameter, indicating a relationship between a variation in voltage of the battery and an SOH (or SOC), a temperature parameter, and the temperature of the electronic device used in an experiment. A detailed description thereof will be described in detail with reference to FIG. 7.

According to an embodiment, the voltage variation obtaining unit 327 may obtain a variation in output voltage (or output voltage level) of the battery while the battery 310 is being charged via an external device. According to an embodiment, the voltage variation obtaining unit 327 may obtain a variation in output voltage (or output voltage level) of the battery 310 at designated intervals while the battery 310 is being partially charged via an external device (e.g., being partially charged or being fully charged from the state of not being fully discharged, or being partially charged from the state of being fully discharged).

According to an embodiment, the voltage variation obtaining unit 327 may obtain a variation in output voltage (or output voltage level) of the battery 310 at designated intervals while the battery 310 is being fully charged via an external device from the state of being fully discharged.

According to an embodiment, the voltage variation obtaining unit 327 may include a configuration for measuring a period of time spent in charging the battery 310 via an external device, in order to obtain a variation in output voltage of the battery 310. For example, the voltage variation obtaining unit 327 may include a real time clock (RTC) for measuring a period of time spent in charging the battery 310 via an external device.

According to an embodiment, if the mapping parameter 331 stored in the memory 330 (or obtained from the memory 330) is configured as a mapping parameter indicating a correlation between a variation in open circuit voltage of the battery and the SOH (or SOC) of the battery, the voltage variation obtaining unit 327 may obtain a variation in open circuit voltage of the battery based on an obtained output voltage and an obtained charging current of the battery 310. For example, the voltage variation obtaining unit 327 may obtain (or calculate) a variation in open circuit voltage of the battery based on an obtained variation in output voltage of the battery 310, an obtained charging current, and the internal resistance of the battery 310 (or performing calculation using the obtained output voltage of the battery, the obtained charging current, and the internal resistance of the battery).

According to an embodiment, the SOH obtaining unit 329 may obtain (or estimate) the SOH (or SOC) of the battery 310 based at least partially on the obtained mapping parameter 331 and an obtained variation in output voltage of the battery 310 (or an obtained variation in open circuit voltage of the battery 310).

According to an embodiment, the SOH obtaining unit 329 may obtain a function that corresponds to (or matches) a variation (or a function of a variation) in output voltage of the battery 310 obtained (or measured) at a designated time (or designated intervals) while the battery 310 is being charged, from among functions, which are associated with a variation in output voltage of the battery during a charging time, and are expressed by the obtained mapping parameter 331.

According to an embodiment, the SOH obtaining unit 329 may obtain the SOH (or SOC) of the battery 310 based at least on functions, which indicate correlations between a variation in output voltage of the battery and the SOH (or SOC) and which are expressed by the obtained mapping parameter 331, and a variation in output voltage of the battery 310 at a designated time while the battery 310 is being charged.

According to an embodiment, the SOH obtaining unit 329 may obtain the SOH (or SOC) of the battery 310 using a statistic estimation model or a machine learning scheme, based at least partially on the obtained mapping parameter 331 and an obtained variation in output voltage of the battery 310 (or an obtained variation in the open circuit voltage of the battery 310).

According to an embodiment, the statistic estimation model may include particle filter, Bayes theorem, Kalman filter, extended Kalman filter, unscented Kalman filter, or the like. In this instance, the statistic estimation model for obtaining the SOH (or SOC) of the battery 310 is not limited to the above-mentioned example.

According to an embodiment, the machine learning scheme may include an artificial neural network, a gradient descent, and the like. In this instance, the machine learning scheme for obtaining the SOH (or SOC) of the battery 310 is not limited to the above-mentioned example.

Although not illustrated in FIG. 3, according to an embodiment, if an external device is connected to the electronic device 101, the processor 320 may further include a configuration to identify whether a charging cycle (cycle or period) for obtaining an SOH (or SOC) arrives. According to an embodiment, the processor 320 may periodically obtain the SOH (or SOC) of the battery 310. For example, the processor 320 may perform an operation of obtaining an SOH (or SOC) every a predetermined number of times of charging the battery 310 (e.g., every 50 charging times). As another example, the processor 320 may perform an operation of obtaining an SOH (or SOC) at regular intervals (e.g., at intervals of a week) for charging the battery 310.

Although not illustrated in FIG. 3, according to an embodiment, the processor 320 may further include a configuration to identify a designated condition for obtaining the SOH (or SOC) of the battery 310. According to an embodiment, if the state of the electronic device 101 corresponds to a designated condition (or satisfies a designated condition), the processor 320 may perform an operation of obtaining the SOH (or SOC) of the battery 310. According to an embodiment, while the battery 310 is being charged, if a function that consumes power greater than or equal to a designated threshold value is performed in the electronic device 101, the processor 320 may not perform an operation of obtaining the SOH (or SOC) of the battery 310. For example, while the battery 310 is being charged, if an application (e.g., a navigation application, a game application, a video application, a call application, or the like) is running in the electronic device 101, the processor 320 may not perform an operation of obtaining the SOH (or SOC) of the battery 310. As another example, while the battery 310 is being charged, if a display is in the turned-on (turn-on) state in the electronic device 101, the processor 320 may not perform an operation of obtaining the SOH (or SOC) of the battery 310. In this instance, the case in which a function that consumes power greater than or equal to a designated threshold is performed in the electronic device 101, is not limited to the mentioned example.

Hereinafter, a method of providing information associated with the state of the battery 310 will be described in detail.

FIGS. 4A to 4E are diagrams illustrating a method of calculating the mapping parameter 331 indicating a relationship between a variation in output voltage of a battery and the SOH of the battery according to various embodiments of the disclosure.

Figure 4A:
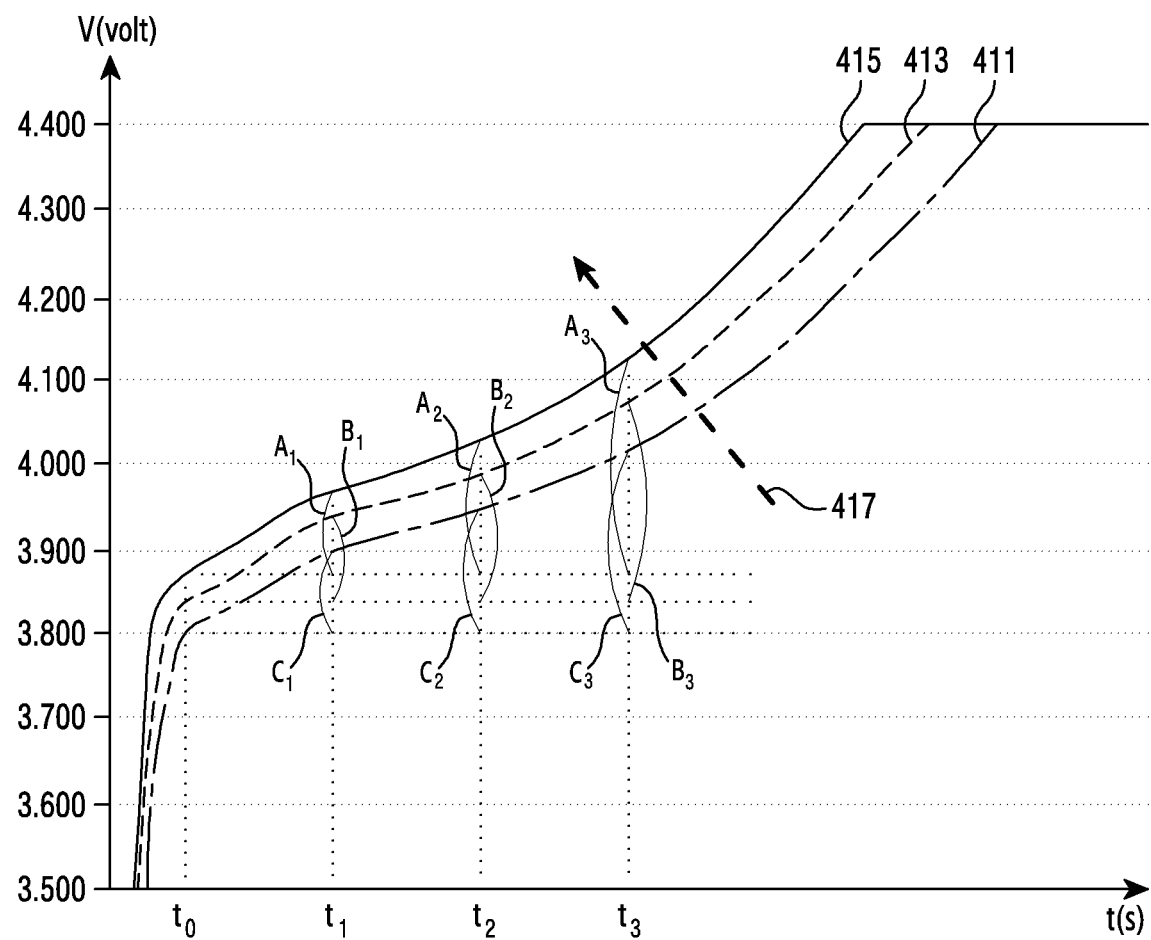

Referring to FIG. 4A, FIG. 4A illustrates a graph 410 (or function) indicating an output voltage (or an output voltage level) of a battery (or a variation in output voltage of the battery) during a charging time, with respect to the SOHs of the battery.

According to an embodiment, the graph 410 may be calculated (or obtained) based on a battery life deterioration experiment performed in an accelerated condition (or environment). According to an embodiment, the graph may be calculated based on a set of data obtained from the battery life deterioration experiment performed in the acceleration condition.

According to an embodiment, a function (or a curve) 411 is a function indicating the output voltage of the battery during a charging time when the SOH of the battery is approximately 1. A function 413 is a function indicating the output voltage of the battery during a charging time when the SOH of the battery is approximately 0.9. A function 415 is a function indicating the output voltage of the battery during a charging time when the SOH of the battery is approximately 0.8. In this instance, the functions 411 to 415 of FIG. 4A which indicate the output voltages of the battery during a charging time at respective SOHs of the battery are examples, and the technical idea of the disclosure is not limited thereto. According to an embodiment, as indicated by an arrow 417, the amount of time spent until the battery reaches a fully charged state becomes shorter from the function 411 to the function 415. According to an embodiment, the functions 411 to 415 may be functions indicating the output voltages of batteries during a charging time, which are obtained while the same current (or the same constant-current) is supplied (e.g., obtained by supplying the same current) to the batteries having different SOHs.

Figure 4B:
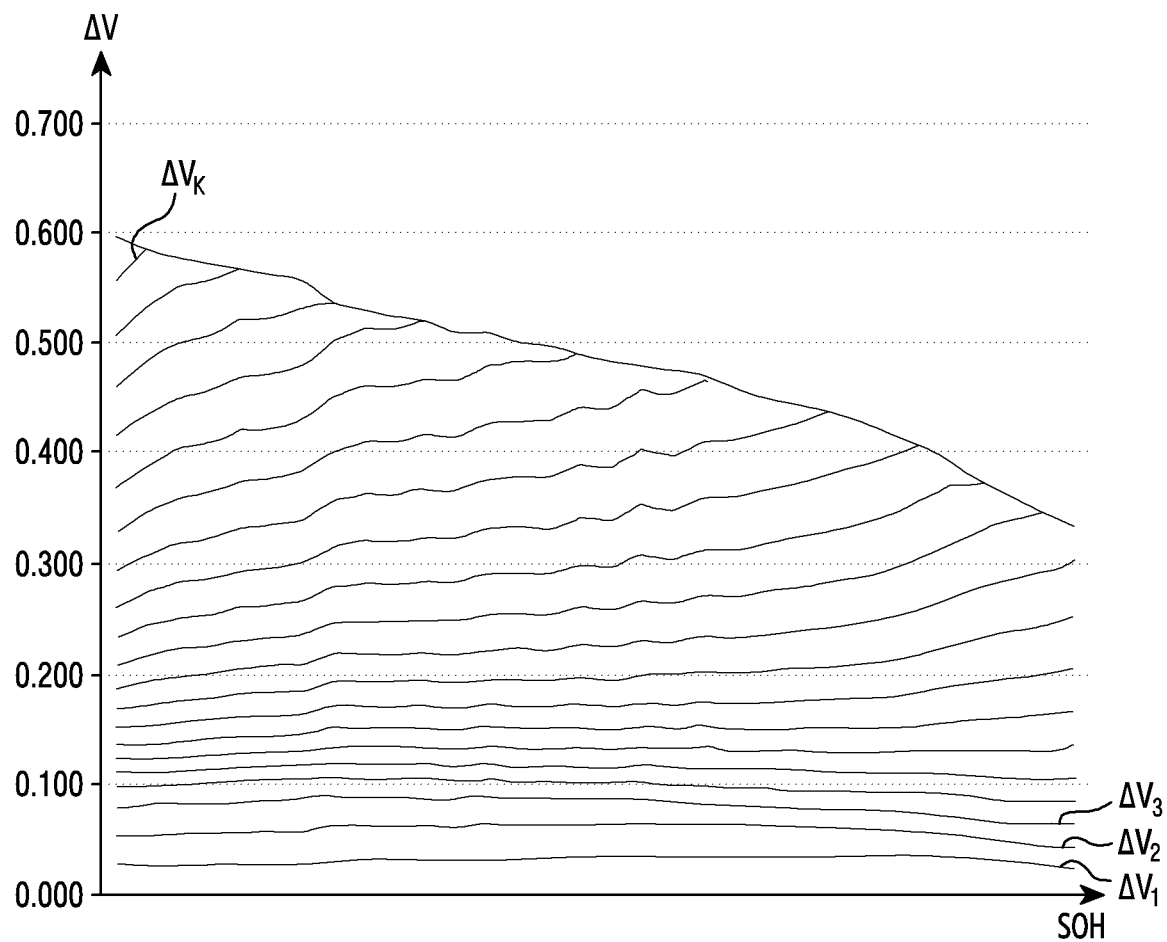

According to an embodiment, a graph 420 of FIG. 4B may be calculated (or derived or drawn) from the graph 410 of FIG. 4A.

Referring to FIG. 4B, FIG. 4B illustrates a graph (or a function) indicating a variation (ΔV) in output voltage of the battery with respect to the SOH of the battery, at a designated charging time (or in a charging time interval) (or at designated charging intervals) while the battery is being charged.

In FIG. 4A, according to an embodiment, in association with the function 415 (or a battery having an SOH corresponding to the function 415), the output voltage (V) of the battery during a period of time from a reference time ($t_0$) to a time ($t_1$) varies by $A_1$(V). In association with the function 413, the output voltage (V) of the battery during a period of time from the reference time ($t_0$) to the time ($t_1$) varies by $B_1$(V). In association with the function 411, the output voltage (V) of the battery during a period of time from the reference time ($t_0$) to the time ($t_1$) varies by $C_1$(V). According to an embodiment, a function ($\Delta V_1$) of FIG. 4B may be a function successively indicating relationships of variations (A1 to C1) in output voltage of the battery with respect to SOHs corresponding to the functions 411 to 415 in the time interval starting from the reference time ($t_0$) to the time ($t_1$).

In FIG. 4A, according to an embodiment, in association with the function 415 (or a battery having an SOH corresponding to the function 415), the output voltage (V) of the battery during a period of time from the reference time ($t_0$) to a time ($t_2$) varies by $A_2$(V). In association with the function 413, the output voltage (V) of the battery during a period of time from the reference time ($t_0$) to the time ($t_2$) varies by $B_2$ (V). In association with the function 411, the output voltage (V) of the battery during a period of time from the reference time ($t_0$) to the time ($t_2$) varies by $C_2$(V). According to an embodiment, a function ($\Delta V_2$) of FIG. 4B may be a function successively indicating relationships of variations ($A_2$ to $C_2$) in output voltage of the battery with respect to SOHs corresponding to the functions 411 to 415 in the time interval from the reference time ($t_0$) to the time ($t_2$).

In FIG. 4A, according to an embodiment, in association with the function 415 (or a battery having an SOH corresponding to the function 415), the output voltage (V) of the battery during a period of time from the reference time (to) to a time ($t_3$) varies by $A_3$(V). In association with the function 413, the output voltage (V) of the battery during a period of time from the reference time ($t_0$) to the time ($t_3$) varies by $B_3$(V). In association with the function 411, the output voltage (V) of the battery during a period of time from the reference time ($t_0$) to the time ($t_3$) varies by $C_3$(V). According to an embodiment, a function ($\Delta V_3$) of FIG. 4B may be a function successively indicating relationships of variations ($A_3$ to $C_3$) in output voltage of the battery with respect to the SOHs corresponding to the functions 411 to 415 in the time interval from the reference time ($t_0$) to the time ($t_3$).

According to an embodiment, a function ($\Delta V_k$) of FIG. 4B may be a function successively indicating relationships of variations ($A_k$ to $C_k$) in output voltage of the battery with respect to the SOHs corresponding to the functions 411 to 415 in the time interval from the reference time ($t_0$) to the time ($t_k$).

According to an embodiment, as illustrated in the graph 420 of FIG. 4B, each of the functions ($\Delta V_1$ to $\Delta V_K$) may successively indicate relationships of the variations in output voltage of the battery with respect to SOHs during a time interval from the reference time ($t_0$).

FIG. 4C, according to an embodiment, may be a table 430 including the values SOHs for each of the functions ($\Delta V_1$ to $\Delta V_K$) of FIG. 4B, as data. For example, the first row 431 of the table 430 shows the values of the SOHs of the function ($\Delta V_1$). The second row 433 of the table 430 shows the values of the SOHs of the function ($\Delta V_2$). The third row 435 of the table 430 shows the values of the SOHs of the function ($\Delta V_3$). The last row 437 of the table 430 shows the values of the SOHs of the function ($\Delta V_k$).

According to an embodiment, based on the graph 420 of FIG. 4B and the table 430 of FIG. 4C, a function indicating a relationship between a variation in output voltage of a battery and an SOH may be calculated for each of the functions ($\Delta V_1$ to $\Delta V_K$), as given in Equation 1 below.

[Equation 1]

$$V_k = a0k + a1k^*SOH_k + a2k^*SOH_k^2 + a3k^*SOH_k^3 \ldots aNk^*SOH_k^N$$

In Equation 1, k is a variable corresponding to a time interval from a reference time ($t_0$) to a time ($t_k$). N denotes the degree of a function. According to an embodiment, N that denotes the degree of a function may be set to an optimal value which is capable of indicating a relationship between $V_k$ and $SOH_k$.

In Equation 1, coefficients a0k to aNk may be mapping parameters, each of which indicates a relationship between V and SOH in a corresponding time interval, among time intervals from the reference time ($t_0$) to a time ranging from a time ($t_1$) to a time ($t_k$).

A table 440 of FIG. 4D, according to an embodiment, may show the mapping parameters 331 calculated based on the graph 420 of FIG. 4B and the table 430 of FIG. 4C.

According to an embodiment, the first column 441 of the table 440 shows a zero-degree coefficient (a01 to a0k) of a function. The second column 443 of the table 440 shows a first-degree coefficient (a01 to a1k) of a function. The third column 445 of the table 440 shows a second-degree coefficient (a02 to a2k) of a function. The last column 447 of the table 440 shows an $n^{th}$-degree coefficient (a0k to aNk) of a function.

According to an embodiment, the first row 442 of the table 440 shows coefficients (a01 to aN1) of a function indicating a relationship between $\Delta V_1$ and $SOH_1$. The second row 444 of the table 440 shows coefficients (a02 to aN2) of a function indicating a relationship between $\Delta V_2$ and $SOH_2$. The last row 446 of the table 440 shows coefficients (a0k to aNk) of a function indicating a relationship between $\Delta V_k$ and $SOH_k$.

FIG. 4E illustrates a matrix 450 including the mapping parameters 331 indicating a relationship between a variation in output voltage of a battery and the SOH of the battery, as elements.

According to an embodiment, as illustrated in FIG. 4E, the matrix 450 may include the mapping parameters 331, for example, a set of coefficients (a01 to aNk) as elements.

According to an embodiment, although not illustrated in FIGS. 4A to 4E, when the mapping parameters 331 indicating a correlation between a variation in output voltage of a battery and the SOH of the battery are calculated, the mapping parameters that differ for each a charging current (or a charging C-rate) may be calculated. For example, in the case in which a mapping parameter indicating a correlation between a variation in the output voltage of the battery and the SOH of the battery is calculated, if the battery is charged using charging currents 1(A), 2(A), and 3(A) in a life deterioration experiment, a mapping parameter for each of charging currents 1(A), 2(A), and 3(A) may be obtained.

Figure 5A:
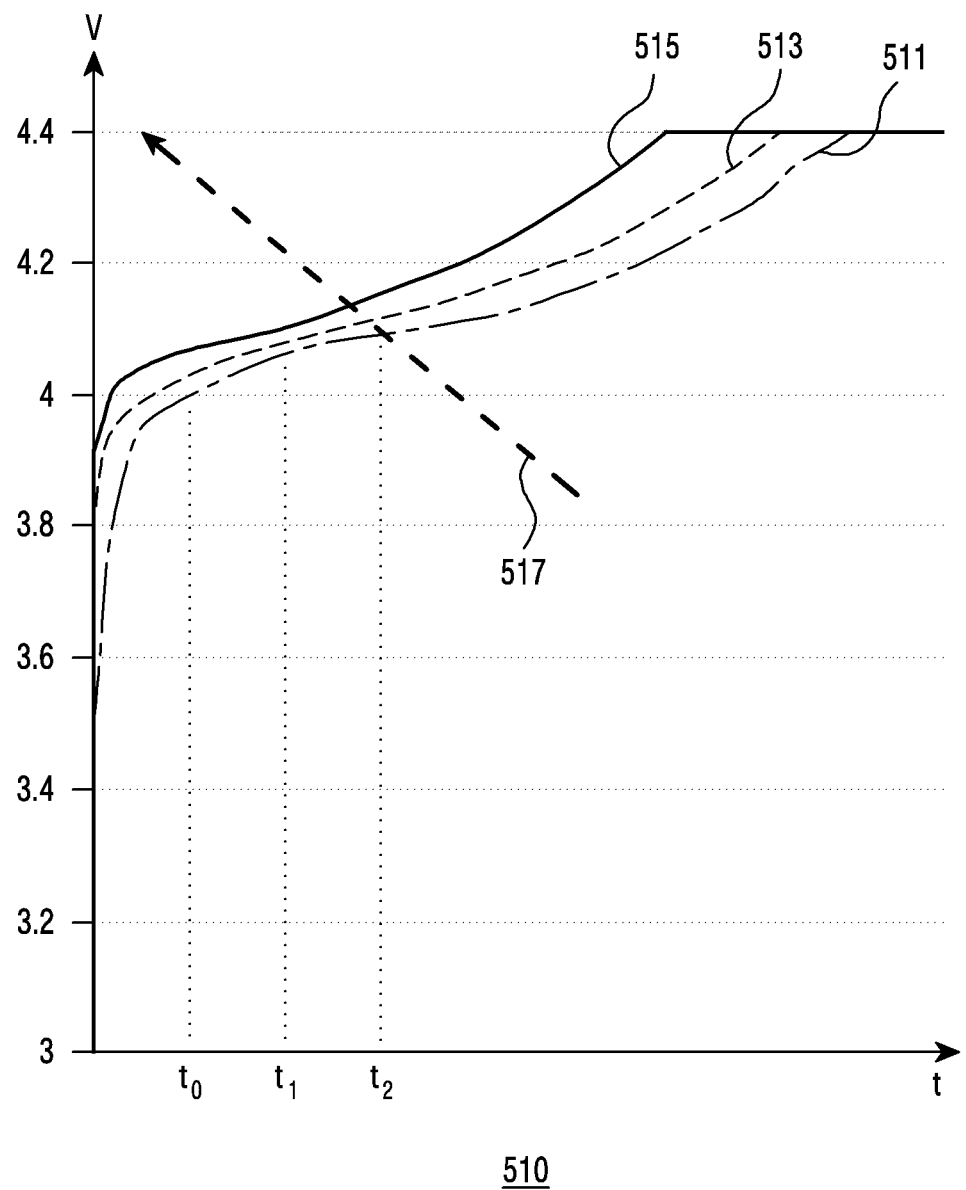
Figure 5B:
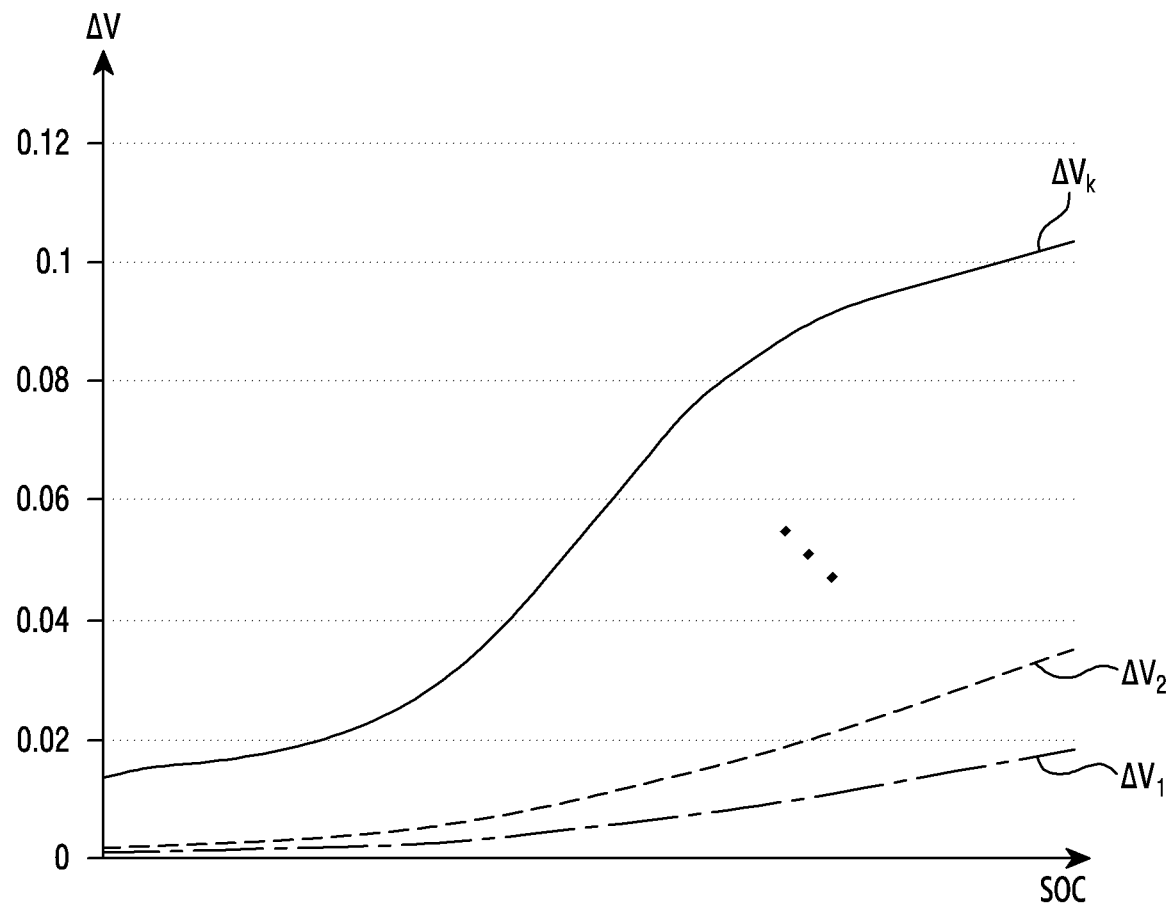

FIGS. 5A to 5C are diagrams illustrating a method of calculating a mapping parameter indicating a relationship between a variation in output voltage of a battery and the SOC of the battery according to various embodiments of the disclosure.

Referring to FIG. 5A, FIG. 5A illustrates a graph 510 (or a function) indicating the output voltage (or the output voltage level) of a battery (or a variation in output voltage of the battery) during a charging time, with respect to the SOCs of the battery.

According to an embodiment, the graph 510 may be calculated (or obtained) based on a battery life deterioration experiment performed in an accelerated condition (or environment).

According to an embodiment, in the graph 510, the SOC of the battery increases from the function 511 to the function 515 as indicated by an arrow 517. According to an embodiment, in the case of a function with a high SOC of the battery, the amount of time that the battery spends in reaching a fully charged state may be short. According to an embodiment, the functions 511 to 515 may be functions indicating the output voltages of batteries having different SOCs during a charging time, which are obtained while the same current (or the same constant-current) is supplied to the batteries.

According to an embodiment, a graph 520 of FIG. 5B may be calculated (or derived or drawn) from the graph 510 of FIG. 5A.

Referring to FIG. 5B, FIG. 5B illustrates a graph 520 (or a function) indicating a variation ($\Delta V$) in output voltage of the battery with respect to the SOC of the battery, at a designated charging time (or in a charging time interval) (or at designated charging intervals) while the battery is being charged.

A function ($\Delta V_1$) of FIG. 5B may be a function successively indicating relationships of variations in output voltage of the battery with respect to SOCs corresponding to the functions 511 to 515 in the time interval from a reference time ($t_0$) to a time ($t_1$).

A function ($\Delta V_2$) of FIG. 5B may be a function successively indicating relationships of variations in output voltage of the battery with respect to SOCs corresponding to the functions 511 to 515 in the time interval from the reference time ($t_0$) to a time ($t_2$).

A function ($\Delta V_k$) of FIG. 5B may be a function successively indicating relationships of variations in output voltage of the battery with respect to SOCs corresponding to the functions 511 to 515 in the time interval from the reference time ($t_0$) to a time ($t_k$).

According to an embodiment, based on the graph of FIG. 5B, a function indicating a relationship between a variation in output voltage of a battery and an SOC may be obtained for each of the functions ($\Delta V_1$ to $\Delta V_K$) as given in Equation 2 below.

[Equation 2]

$$V_k = \overline{a0k} + \overline{a1k}*SOC_k + \overline{a2k}*SOC_k^2 + \overline{a3k}*SOC_k^3 \ldots \overline{aNk}*SOC_k^N$$

In Equation 2, k is a variable corresponding to a time interval from a reference time ($t_0$) to a time ($t_k$). N denotes the degree of a function. According to an embodiment, N that denotes the degree of a function may be set to an optimal value capable of indicating a relationship between $V_k$ and $SOC_k$.

In Equation 2, coefficients $\overline{a0k}$ to $\overline{aNk}$ may be mapping parameters, each of which indicates a relationship between $V_k$ and $SOC_k$ in a corresponding time interval among time intervals from the reference time ($t_0$) to a time ranging from a time ($t_1$) to a time ($t_k$).

FIG. 5C illustrates a matrix 530 including the mapping parameters 331 indicating a relationship between a variation in output voltage of a battery and the SOC of the battery, as elements.

According to an embodiment, as illustrated in FIG. 5C, the matrix 530 may include the mapping parameters 331, for example, a set of coefficients to ($\overline{a01}$ to $\overline{aNk}$) as elements.

According to an embodiment, although not illustrated in FIGS. 5A to 5C, when the mapping parameters 331 indicating a correlation between a variation in output voltage of a battery and the SOC of the battery are calculated, the mapping parameters that differ for each a charging current (or a charging C-rate) may be calculated.

FIG. 6 is a diagram illustrating a matrix 600 including mapping parameters as elements, the mapping parameters indicating a relationship between a variation in open circuit voltage of a battery and the SOH of the battery, according to various embodiments of the disclosure.

According to an embodiment, mapping parameters 331 indicating a relationship between a variation in open circuit voltage of a battery and the SOH of the battery may be calculated in a manner that is the same as, or similar to, the method of calculating the mapping parameters 331 indicating a relationship between a variation in the output voltage of a battery and the SOH or SOC of the battery, as described in FIGS. 4A to 4E and FIGS. 5A to 5C.

According to an embodiment, the open circuit voltage of the battery, the output voltage of the battery, the charging current of the battery, and the internal resistance of the battery may be calculated using Equation 3 shown below.

[Equation 3]

$$V_{OCV} = V_{cell} + I*R_{var}$$

In Equation 3, $V_{OCV}$ denotes the open circuit voltage of a battery. $V_{cell}$ denotes the output voltage of a battery (or the closed circuit voltage of a battery). I denotes a charging current. $R_{var}$ denotes a varying internal resistance of a battery.

According to an embodiment, in a life deterioration experiment performed for obtaining the mapping parameters 331, a variation in open circuit voltage of a battery over time may be calculated using a variation in output voltage of the battery over time, a charging current, and the internal resistance of the battery, while batteries having different SOHs (or SOCs) are being charged.

According to an embodiment, a function indicating a relationship between a variation in open circuit voltage of a battery and an SOH or SOC may be calculated in a manner that is the same as, or similar to, the method of calculating mapping parameters 331 indicating a relationship between a variation in output voltage of a battery and the SOH or SOC of the battery, described in FIGS. 4A to 4C and FIGS. 5A and 5B.

According to an embodiment, the function indicating a relationship between a variation in open circuit voltage of a battery and an SOH may be calculated as shown in Equation 4.

[Equation 4]

$$V_{OCV,k} = a\dot{0}k + a\dot{1}k*SOH_k + a\dot{2}k*SOH_k^2 + a\dot{3}k*SOH_k^3 \ldots a\dot{N}k*SOH_k^N$$

In Equation 4, k is a variable corresponding to a time interval from a reference time ($t_0$) to a time ($t_k$). N denotes the degree of a function.

In Equation 4, coefficients $a\dot{0}k$ to $a\dot{N}k$ may be mapping parameters, each of which indicates a relationship between a variation ($V_k$) in open circuit voltage of a battery and an SOH($SOH_k$) in a corresponding time interval among time intervals to a time ranging from a time ($t_1$) to a time ($t_k$).

[Equation 5]

$$V_{OCV,k} = a\ddot{0}k + a\ddot{1}k*SOH_k + a\ddot{2}k*SOH_k^2 + a\ddot{3}k*SOH_k^3 \ldots a\ddot{N}k*SOH_k^N$$

In Equation 5, k denotes a variable corresponding to a time interval from a reference time ($t_0$) to a time ($t_k$). $V_{OCV,k}$ denotes a variation in open circuit voltage of a battery, which varies during a time interval from the reference time ($t_0$) to the time ($t_k$). N denotes the degree of a function.

In Equation 5, coefficients a0̈ to sN̈k may be mapping parameters, each of which indicates a relationship between a variation ($V_k$) in open circuit voltage of a battery and an SOH($SOH_k$) in a corresponding time interval among time intervals to a time ranging from a time ($t_1$) to a time ($t_k$).

According to an embodiment, as illustrated in FIG. 6, the matrix 600 may include the mapping parameters 331, for example, a set of coefficients (a01 to aN̈k) as elements.

According to an embodiment, in the case of calculating mapping parameters in FIGS. 4 and 5, mapping parameters that differ depending on a charging current (or charging C-rate) are calculated. However, the open circuit voltage of the battery is independent from (irrespective of) the charging current and the internal resistance of the battery (or the open circuit voltage of the battery is not changed due to the charging current and the internal resistance of the battery). Accordingly, in the case of calculating the mapping parameters 331 indicating a correlation between a variation in open circuit voltage of the battery and the SOH or SOC of the battery in FIG. 6, there is no need to calculate mapping parameters that differ depending on a charging current (or charging C-rate).

Figure 7A:
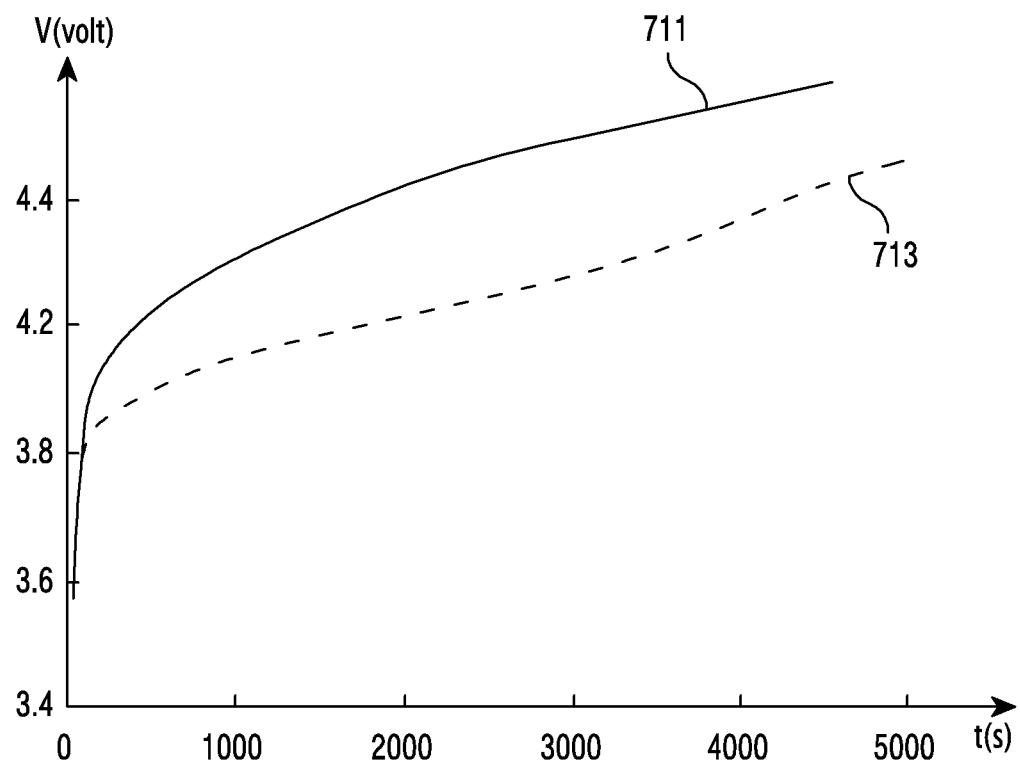
FIGS. 7A to 7C are diagrams illustrating a method of calculating a mapping parameter indicating a relationship between a variation in voltage of a battery and the SOH of the battery according to various embodiments of the disclosure.
Figure 7B:
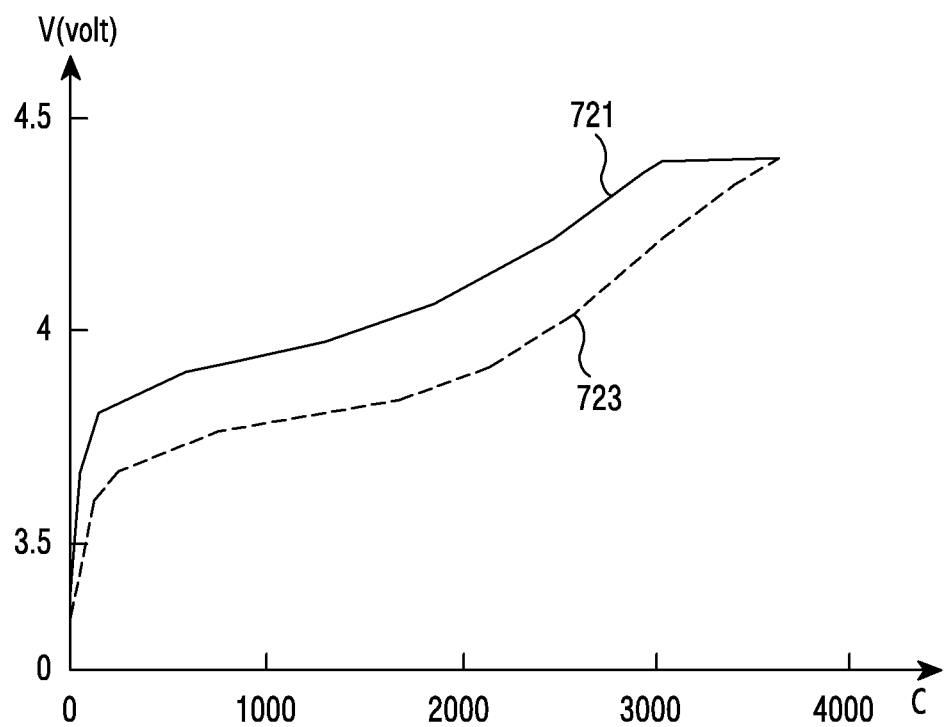
Figure 7C:
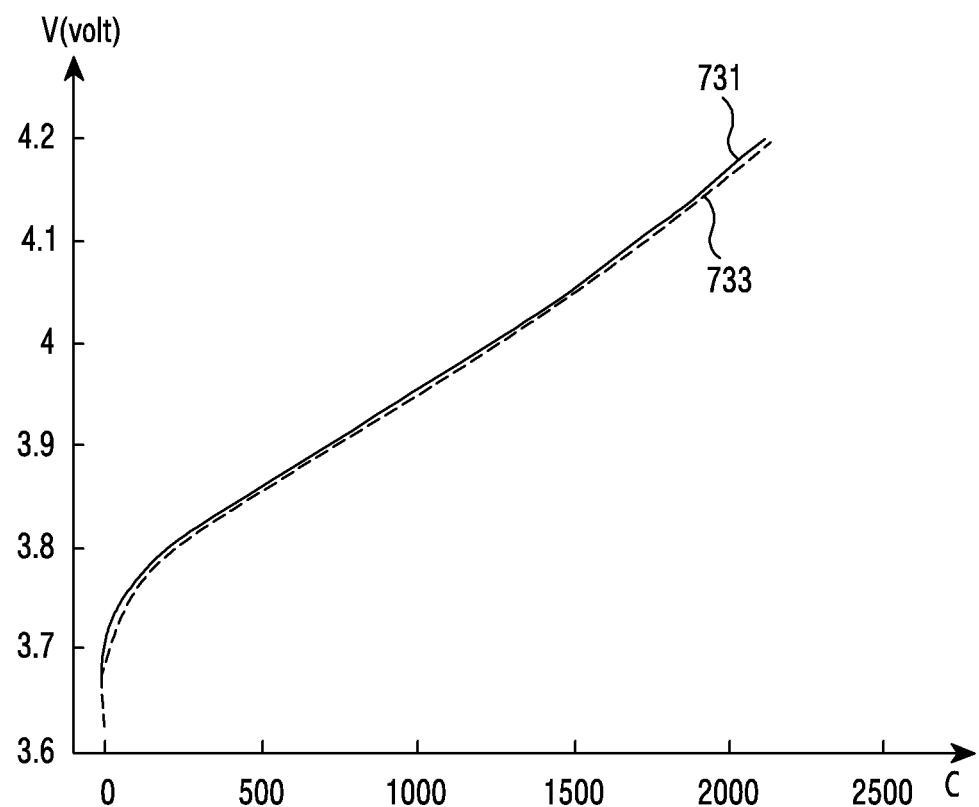

FIGS. 7A to 7C are diagrams illustrating a method of calculating a mapping parameter indicating a relationship between a variation in voltage of a battery and the SOH of the battery according to various embodiments of the disclosure.

Reference is made to FIGS. 7A to 7C. According to an embodiment, FIG. 7A may be a graph indicating a variation in voltage of a battery, while the battery is being charged using different charging currents.

According to an embodiment, a function (or a curve) 711 shows a variation in voltage of a battery while a current of approximately 2550 mA is being supplied to the battery. A function 713 shows a variation in voltage of the battery while a current of approximately 1000 mA is being supplied to the battery.

According to an embodiment, as illustrated in FIG. 7A, if a different charging current is used, a different output voltage of the battery may be obtained.

According to an embodiment, FIG. 7B is a graph indicating a variation in output voltage of the battery with respect to the amount of charge (C) obtained by adding up (or integrating) different charging currents in a designated interval, while the battery is being charged using different charging currents. For example, a function 721 shows a variation in output voltage of the battery with respect to the amount of charge added up while a charging current of approximately 2550 mA is being supplied to the battery. A function 723 shows a variation in output voltage of the battery with respect to the amount of charge added up while a charging current of approximately 1000 mA is being supplied to the battery.

According to an embodiment, upon comparison between the function 721 and the function 723, it is identified that the output voltage of the function 721 is higher than the output voltage of the function 723 as the amount of charge (C) is increased. According to an embodiment, in a designated interval, as the amount of charge (C) is increased, a variation in output voltage of the function 721 and a variation in output voltage of the function 723 may be the same.

According to an embodiment, mapping parameters indicating a relationship between a variation in output voltage of a battery and an SOH, as shown in Equation 6 below, may be calculated in consideration that a variation in output voltage of the function 721 as the amount of charge (C) is increased is the same as a variation in output voltage of the function 723.

[Equation 6]

$$V_k = a\ddot{0}_k + a\ddot{1}_k*SOH_k + a\ddot{2}_k*SOH_k^2 a\ddot{3}_k*SOH_k^3 \ldots a\ddot{N}_k*SOH_k^N$$

In Equation 6, k is a variable corresponding to a time interval from a reference time ($t_0$) to a time ($t_k$). N denotes the degree of a function.

According to an embodiment, Equation 6 is an equation calculated equivalently for different charging currents, and may be calculated using various charging currents.

According to an embodiment, FIG. 7C is a graph indicating a variation in open circuit voltage of a battery with respect to the amount of charge (C) obtained by adding up (or integrating) different charging currents in a designated interval, while the battery is being charged using different charging currents. For example, a function 731 shows a variation in open circuit voltage of the battery with respect to the amount of charge added up while a charging current of approximately 2550 mA is being supplied to the battery. A function 733 shows a variation in open circuit voltage of the battery with respect to the amount of charge added up while a charging current of approximately 1000 mA is being supplied to the battery.

According to an embodiment, as illustrated in FIG. 7C, as the amount of charge (C) is increased, the open circuit voltage of the function 731 and the open circuit voltage of the function 723 may vary equivalently in a designated interval. According to an embodiment, in a designated interval, as the amount of charge (C) is increased, a variation in open circuit voltage of the function 731 and a variation in open circuit voltage of the function 723 may be identical.

According to an embodiment, mapping parameters indicating a relationship between a variation in output voltage of a battery and an SOH, as shown in Equation 7 below, may be calculated in consideration that a variation in output voltage of the function 721 as the amount of charge (C) is increased is the same as a variation in output voltage of the function 723.

[Equation 7]

$$V_{OCV} = \overline{a0k} + \overline{a1k}*SOH_k + \overline{a2k}*SOH_k^2 + \overline{a3k}*SOH_k^3 \ldots \overline{aNk}*SOH_k^N$$

In Equation 7, k is a variable corresponding to a time interval from a reference time ($t_0$) to a time ($t_k$). N denotes the degree of a function.

According to an embodiment, Equation 7 is an equation calculated equivalently for different charging currents, and may be calculated using various charging currents.

FIG. 8 is a diagram illustrating a matrix 800 including a temperature parameter as an element, the temperature parameter being used for obtaining a mapping parameter, according to various embodiments of the disclosure.

According to an embodiment, the mapping parameters 331 (e.g., a01 to a0N, $\overline{a01}$ to $\overline{aNK}$, a0̈1 to aN̈k, a0̈1 to aN̈k) may be parameters that vary (or reflect the ambient temperature of the electronic device 101) depending on the temperature of the electronic device 101 (e.g., the ambient temperature of the electronic device 101 or the internal temperature of the electronic device 101).

For example, as shown in Equation 8 below, a coefficient (a$\dot{\text{N}}$k) of a mapping parameter indicating a relationship between a variation in open circuit voltage of a battery and an SOH may include a function associated with a temperature.

[Equation 8]

$$a\dot{N}k = b0k + b1k*T + b2k*T^2 + b3k*T^3 \ldots bNk*T^N$$

In Equation 8, k is a variable corresponding to a time interval from a reference time ($t_0$) to a time ($t_k$). N denotes the degree of a function. T denotes a temperature.

In Equation 8, coefficients (b0k to bNk) may be temperature parameters for calculating a correlation (or a function) between a coefficient (a$\dot{\text{N}}$k) and a temperature (T).

According to an embodiment, via life deterioration experiments performed in various temperature conditions (e.g., approximately 25° C., approximately 35° C., approximately 45° C., or approximately 55° C.), a coefficient (e.g., a$\dot{\text{N}}$k) of a mapping parameter at a temperature (T) is obtained (or calculated), and coefficients (b0k to bNk) may be calculated by substituting the temperature (T) to Equation 8.

According to an embodiment, as illustrated in FIG. 7, the matrix 800 may include temperature parameters, for example, a set of coefficients (b01 to bNk) as elements.

Although FIG. 8 illustrates temperature parameters of a coefficient (A$\dot{\text{N}}$k) of a mapping parameter indicating a relationship between a variation in open circuit voltage of the battery and an SOH, the disclosure is not limited thereto. For example, via a life deterioration experiment, temperature parameters for each mapping parameter (e.g., a01 to a0N, a0$\dot{\text{I}}$ to a$\dot{\text{N}}$k, and a$\dot{\text{0}}$1 to a$\dot{\text{N}}$k) may be calculated.

Although not illustrated in FIGS. 4 to 8, the SOH or SOC of the battery may be obtained via a life deterioration experiment performed in an acceleration condition (e.g., a condition of a temperature higher than room temperature). For example, an acceleration factor (AF) in a life deterioration experiment may be calculated via Arrhenius.

$$AF = \frac{\tau d}{\tau a} = A\exp\left(\frac{E_a}{kT_d}\right) / A\exp\left(\frac{E_a}{kT_a}\right) = \exp\left\{\frac{E_a}{k}\left[\frac{1}{T_d} - \frac{1}{T_a}\right]\right\} \quad \text{[Equation 9]}$$

In Equation 9, $\tau$ denotes a fault time (or a time constant). $E_a$ denotes activation energy of Li-ion. k denotes a Boltzmann constant. $T_d$ denotes the temperature of an environment where a user actually charges a battery. $T_a$ denotes the temperature of an environment where an experimenter charges a battery in an experiment.

According to an embodiment, if the reliable SOH or the SOC of a battery is capable of being obtained, for example, at intervals of 100 charging cycles, in the environment where a user actually charges the battery (or at the temperature of the environment), a life deterioration experiment may be performed in an acceleration condition having, for example, an acceleration factor of 2 (e.g., a temperature condition in which an acceleration factor is approximately 2) and thus, cycle information corresponding to a user condition in association with approximately 200 charging cycles may be obtained.

An electronic device according to various embodiments of the disclosure may include a memory storing one or more mapping parameters indicating a correlation between a variation in voltage of the battery and the state of health (SOH) of the battery, and a processor, wherein the processor is configured to: detect that an external device for charging the battery is connected to the electronic device; charge the battery using a charging current supplied from the external device, and determine, based at least on the charging current, at least one mapping parameter among the one or more mapping parameters; identify a variation in voltage of the battery while charging the battery; and obtain an SOH of the battery based at least on the at least one mapping parameter and the variation in voltage.

According to various embodiments, the memory may further include another mapping parameter which indicates a correlation between a variation in voltage of the battery and the state of charging (SOC) of the battery.

According to various embodiments, the variation in voltage of the battery may include a variation in a closed circuit voltage of the battery, and the one or more mapping parameters may include mapping parameters which indicate a correlation between a variation in a closed circuit voltage of the battery and an SOH, and which are configured differently depending on a designated charging current.

According to various embodiment, the variation in voltage of the battery may include a variation in an open circuit voltage of the battery, the one or more mapping parameters may include a mapping parameter indicating a correlation between the variation in the open circuit voltage of the battery and an SOH, and the processor may be configured to obtain, based at least on the charging current, the variation in voltage including the variation in the open circuit voltage of the battery.

According to various embodiments, the one or more mapping parameters may include a mapping parameter indicating a correlation with an SOH in association with a temperature, and the processor may be configured to: obtain a temperature of the electronic device using a sensor module; and determine, based on the temperature, the at least one mapping parameter among the one or more mapping parameters.

According to various embodiments, the processor may be configured to obtain the SOH of the battery using a statistic estimation model, based at least on the at least one mapping parameter and the variation in voltage.

According to various embodiments, the processor may be configured to obtain the SOH of the battery using a machine learning scheme, based at least on the at least one mapping parameter and the variation in voltage.

According to various embodiments, the processor may be configured to: identify whether the state of the electronic device corresponds to a designated condition for obtaining the SOH of the battery, and corresponds to a charging cycle for obtaining the SOH of the battery; and obtain the SOH of the battery if the state of the electronic device is identified as corresponding to the designated condition for obtaining the SOH of the battery, and is identified as corresponding to the charging cycle for obtaining the SOH of the battery.

According to various embodiments, the processor may be configured to obtain a variation in voltage, based at least on the variation in voltage during a designated period of time in which the battery is being charged.

According to various embodiments, after obtaining the SOH of the battery, the obtained SOH of the battery may be compared with the SOH of the battery obtained in advance or a critical SOH. If it is identified that the difference between the obtained SOH of the battery and the SOH of the battery obtained in advance is greater than or equal to a designated threshold value or the obtained SOH of the battery reaches the critical SOH, configuration is performed so as to provide a notification related to the SOH of the battery.

Figure 9:
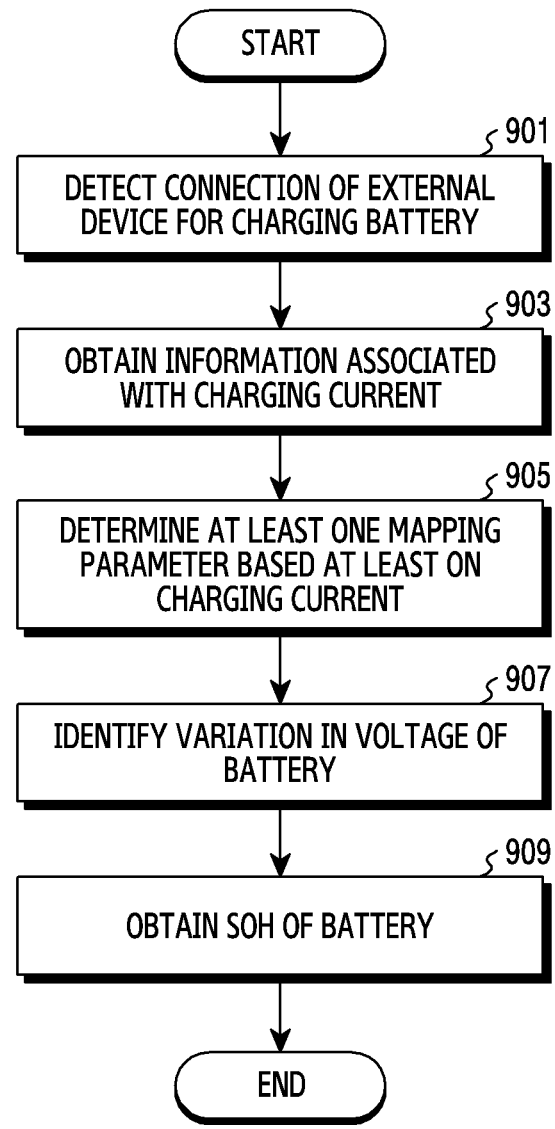
FIG. 9 is a flowchart illustrating a method of providing information associated with the state of a battery according to various embodiments of the disclosure.

FIG. 9 is a flowchart illustrating a method of providing information associated with the state of the battery 310 according to various embodiments of the disclosure.

Referring to FIG. 9, in operation 901, according to an embodiment, the processor 320 may detect a connection of an external device for charging the battery 310.

According to an embodiment, the processor 320 may detect whether the external device (e.g., a USB charging device, a travel adapter, an external battery, or an in-vehicle charging device) is connected to the electronic device 101 (e.g., a battery connector) in a wired manner. According to an embodiment, the external device connection detector 321 may detect whether the external device for charging the battery 310 (e.g., a wireless charger, a wireless charging pad, a wireless charging cradle, or a wireless charging case) is connected in a wireless manner. In this instance, the external device for charging the battery 310 is not limited to the above-mentioned examples.

In operation 903, according to an embodiment, the processor 320 may obtain information associated with a charging current supplied via the external device. According to an embodiment, the processor 320 may obtain the level (or magnitude) of the charging current. According to an embodiment, the charging current may be a constant current. According to an embodiment, the processor 320 may obtain information associated with the charging current by measuring a current supplied from the external device to the battery. According to an embodiment, the charging current obtaining unit 321 may obtain information associated with the charging current, via communication with the external device.

In operation 905, according to an embodiment, the processor 320 may determine at least one mapping parameter among mapping parameters 331 stored in the memory 330, based at least on the charging current.

According to an embodiment, if the mapping parameter 331 stored in the memory 330 is configured as a mapping parameter (e.g., a01 to a0N, $\overline{a01}$ to $\overline{aNk}$) indicating a correlation between a variation in output voltage of the battery and the SOH (or SOC) of the battery, the processor 320 may obtain (may determine, as at least one mapping parameter) a mapping parameter corresponding to the obtained charging current from among mapping parameters stored for respective charging currents (or charging C-rates).

According to an embodiment, if the mapping parameter 331 stored in the memory 330 is configured as a mapping parameter (e.g., to , to ) indicating a correlation between a variation in open circuit voltage of the battery and the SOH (or SOC) of the battery, the processor 320 may obtain, from the memory 330, a mapping parameter indicating a correlation between a variation in open circuit voltage of the battery and the SOH (or SOC) of the battery.

According to an embodiment, the processor 320 may obtain a mapping parameter (e.g., a01 to a0N, $\overline{a01}$ to $\overline{aNk}$, a0̇1 to aṄk, or a0̇1 to aṄk) based at least partially on the temperature of the electronic device 101 which the electronic device 101 obtains using the sensor module 176 (e.g., a temperature sensor). For example, the processor 320 may obtain a temperature parameter (e.g., b0k to bNk) corresponding to a mapping parameter (a0̇1 to aṄk) indicating a relationship between a variation in open circuit voltage of the battery and an SOH, and may apply (or substitute) the obtained temperature of the electronic device 101 to a function indicating a relationship among a mapping parameter, the temperature of the electronic device used in an experiment, and a temperature parameter (e.g., b0k to bNk) as shown in Equation 8, so as to obtain the mapping parameter 331.

In operation 907, according to an embodiment, the processor 320 may identify a variation in output voltage (or output voltage level) of the battery 310, while the battery 310 is being charged via the external device.

According to an embodiment, the processor 320 may identify a variation in output voltage (or output voltage level) of the battery 310 at designated intervals while the battery 310 is being partially charged (e.g., being partially charged or being fully charged from the state of not being fully discharged, or being partially charged from the state of being fully discharged) via the external device.

According to an embodiment, the processor 320 may identify a variation in output voltage (or output voltage level) of the battery 310 at designated intervals while the battery 310 is being fully charged from the state of being fully discharged, via the external device.

According to an embodiment, the processor 320 may include a configuration for measuring a period of time spent in charging the battery 310 via the external device, in order to identify a variation in output voltage of the battery 310. For example, the voltage variation obtaining unit 327 may include a real time clock (RTC) for measuring a period of time spent in charging the battery via the external device.

According to an embodiment, if the mapping parameter 331 stored in the memory 330 (or obtained from the memory 330) is configured as a mapping parameter indicating a correlation between a variation in open circuit voltage of the battery and the SOH (or SOC) of the battery, the processor 320 may identify a variation in open circuit voltage of the battery based on the obtained output voltage and the obtained charging current of the battery 310. For example, based on the obtained variation in output voltage of the battery 310, the obtained charging current, and the internal resistance of the battery 310 (or by performing calculation using the obtained output voltage of the battery 310, the obtained charging current, and the internal resistance of the battery 310), the processor 320 may identity (or obtain or calculate) a variation in open circuit voltage of the battery 310.

Although FIG. 9 illustrates that operation 907 is performed after operations 903 and 905, the sequence of the operations are not limited thereto. For example, operation 907 may be performed after operation 901, or may be performed before operation 903 or 905.

In operation 909, according to an embodiment, the processor 320 may obtain (or estimate) the SOH (or SOC) of the battery 310 based at least partially on the obtained mapping parameter 331 and the obtained variation in output voltage of the battery 310 (or the obtained variation in open circuit voltage of the battery 310).

According to an embodiment, the processor 320 may obtain a function corresponding to (or that matches) a variation in output voltage (or a variation function) of the battery 310 obtained (or measured) at a designated time (or designated intervals) while the battery 310 is being charged, among functions which are associated with a variation in output voltage of the battery during a charging time, and expressed by the obtained mapping parameter. According to an embodiment, the processor 320 may identify an SOH (or SOC) corresponding to (or indicating) the obtained function of a variation in output voltage of the battery 310 during a charging time, so as to obtain the SOH (or SOC). This will be described in detail with reference to FIG. 9.

According to an embodiment, the processor 320 may obtain the SOH (or SOC) of the battery 310 based at least on the functions, which indicate correlations between a variation in output voltage of the battery and the SOH (or SOC) and are expressed by the obtained mapping parameter 331, and a variation in output voltage of the battery 310 at a designated time while the battery 310 is being charged. This will be described in detail with reference to FIG. 10.

According to an embodiment, the processor 320 may obtain the SOH (or SOC) of the battery using a statistic estimation model or a machine learning scheme, based at least partially on the obtained mapping parameter 331 and the obtained variation in output voltage of the battery 310 (or the obtained variation in open circuit voltage of the battery 310).

According to an embodiment, the statistic estimation model may include particle filter, Bayes theorem, Kalman filter, extended Kalman filter, unscented Kalman filter, or the like. In this instance, the statistic estimation model for obtaining the SOH (or SOC) of the battery is not limited to the above-mentioned example.

According to an embodiment, the machine learning scheme may include artificial neural network, gradient descent, or the like. In this instance, the machine learning scheme for obtaining the SOH (or SOC) of the battery 310 is not limited to the above-mentioned example.

Figure 10:
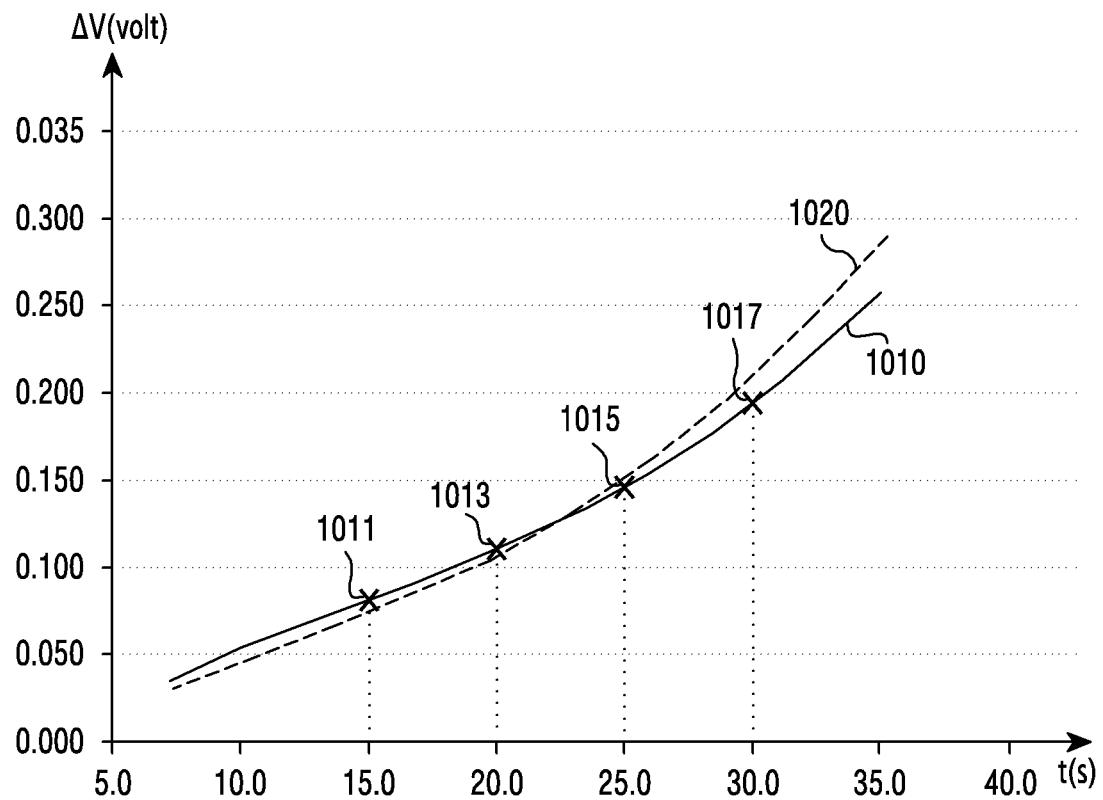
FIGS. 10 and 11 are diagrams illustrating a method of obtaining an SOH according to various embodiments of the disclosure.
Figure 11:
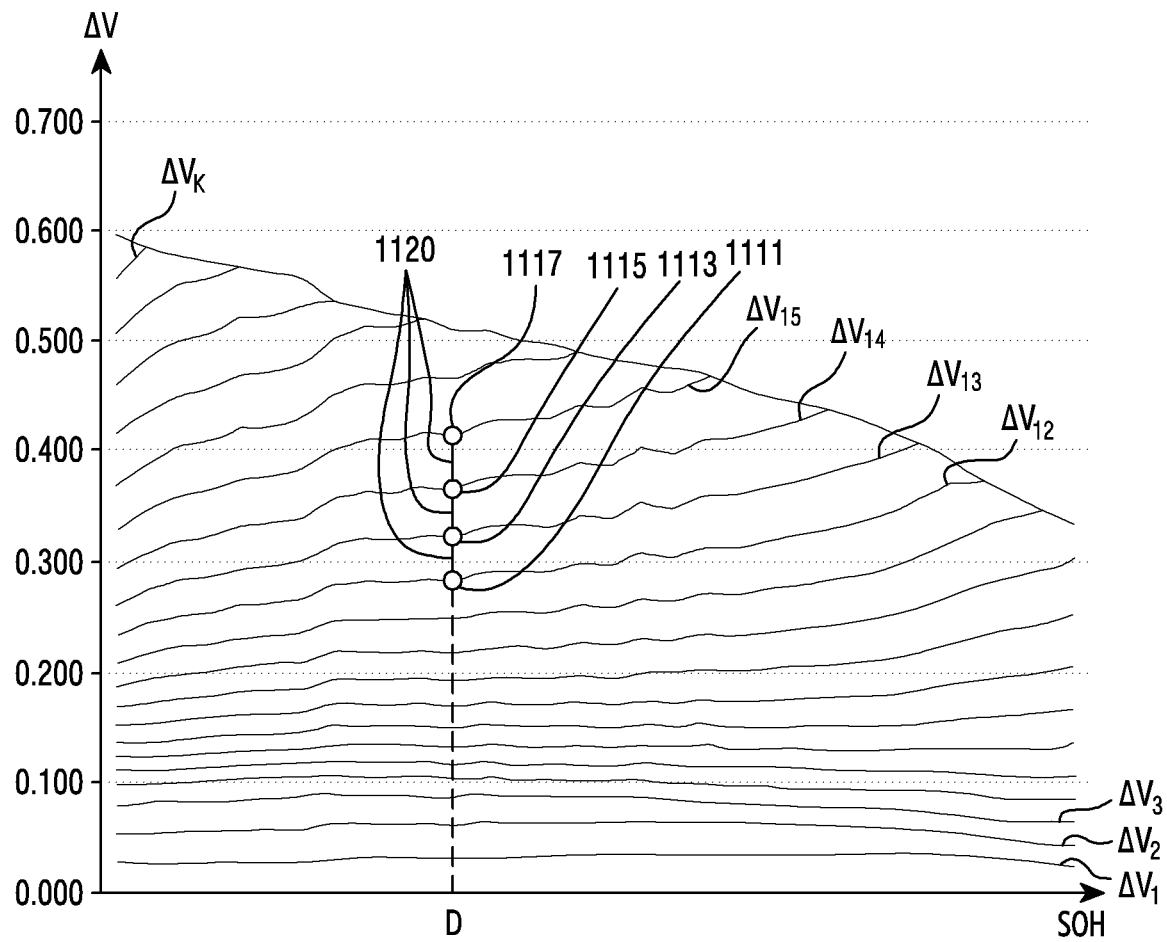

FIGS. 10 and 11 are diagrams illustrating a method of obtaining an SOH according to various embodiments of the disclosure.

In FIG. 10, each of functions 1010 and 1020 (or curves) may indicate a variation in voltage of a battery (e.g., the output voltage of a battery or the open circuit voltage of a battery) during a charging time, with respect to different SOHs (which corresponds to a different SOH) of the battery. The functions 1010 and 1020 (or curves) may be functions corresponding to obtained mapping parameters (or functions expressed by the obtained mapping parameters).

In FIG. 10, the symbols (X) 1011 to 1017 may indicate variations in voltage of a battery measured at designated time intervals while the battery is being charged (or while the battery is partially being charged during an interval from an approximately a 10-second point to an approximately 30-second point). For example, the symbol 1011 may indicate a variation in voltage of the battery during an interval from a reference point of an approximately 10-second point to an approximately 15-second point. The symbol 1013 may indicate a variation in voltage of the battery during an interval from a reference point of an approximately 10-second point to an approximately 20-second point.

According to an embodiment, the processor 320 may determine the most approximate function 1010 that matches (or is identical to) the trace (or curve) of the variations in voltage measured at designated intervals (or the trace of variations in voltage indicated by the symbols (X) 1011 to 1017), among the functions 1010 and 1020 indicating a variation in output voltage of the battery during a charging time. According to an embodiment, the processor 320 may determine the most approximate function 1010 that matches (or is identical to) the trace (or the curve) of variations in voltage measured at designated intervals, among the functions 1010 and 1020 associated with a variation in output voltage of the battery during the charging time, via a statistic estimation model or a machine learning scheme. According to an embodiment, the processor 320 may determine an SOH corresponding to the function 1010 (or indicated by the function 1010) as the current SOH of the battery.

Although FIG. 10 illustrates that the functions 1010 and 1020 correspond to different SOHs, the processor 320 may obtain the current SOC of the battery based on functions corresponding to different SOCs using a method that is the same as, or similar to, the method described in FIG. 10.

FIG. 11 illustrates a graph (or a function) indicating a variation ($\Delta V$) in output voltage of a battery with respect to the SOH of the battery, at a designated charging time (or a charging time interval) (or at designated charging intervals) while the battery is being charged. The graph of FIG. 11 may be the same as, or similar to, the graph of FIG. 4B.

In FIG. 11, the symbols (o) 1111 to 1117 may indicate variations in voltage of a battery measured at designated time intervals while the battery is being charged (or while the battery is being partially charged during an interval from an approximately 10-second point to an approximately 30-second point). For example, the symbol 1111 may indicate a variation in voltage of the battery during an interval from a reference point of an approximately 10-second point to an approximately 15-second point. The symbol 1113 may indicate a variation in voltage of the battery during an interval from a reference point of an approximately 10-second point to an approximately 20-second point.

In FIG. 11, according to an embodiment, based on functions ($\Delta V_1$ to $\Delta V_k$), the processor 320 may determine an SOH (D) corresponding to the most approximate line 1120 (or voltage variations) that matches (or is identical to) the trace (or the straight line) of the variations in output voltage of the battery which correspond to the symbols (o) 1111 to 1117, as the SOH of the battery. For example, in FIG. 11, at the SOH (D) of the battery, the difference between $\Delta V_{15}$ and $\Delta V_{14}$ may match the difference between a variation in output voltage of the battery which corresponds to the symbol 1117 and a variation in output voltage of the battery which corresponds to the symbol 1115. The difference between $\Delta V_{14}$ and $\Delta V_{13}$ may match the difference between a variation in output voltage of the battery which corresponds to the symbol 1115 and a variation in output voltage of the battery which corresponds to the symbol 1113. The difference between $\Delta V_{13}$ and $\Delta V_{12}$ may match the difference between a variation in output voltage of the battery which corresponds to the symbol 1113 and a variation in output voltage of the battery which corresponds to the symbol 1111.

According to an embodiment, via a statistic estimation model or a machine learning scheme, based on functions ($\Delta V_1$ to $\Delta V_k$), the processor 320 may determine an SOH (D) corresponding to the most approximate line 1120 (or voltage variations) that matches (or is identical to) the trace (or the straight line) of the variations in output voltage of the battery which correspond to the symbols (o) 1111 to 1117, as the SOH of the battery.

Although FIG. 11 illustrates the method of obtaining the SOH of the battery using the functions $\Delta V_1$ to $\Delta V_k$, the processor 320 may be capable of obtaining the SOC of the battery using a method that is the same as, or similar to, the method of FIG. 11.

Figure 12:
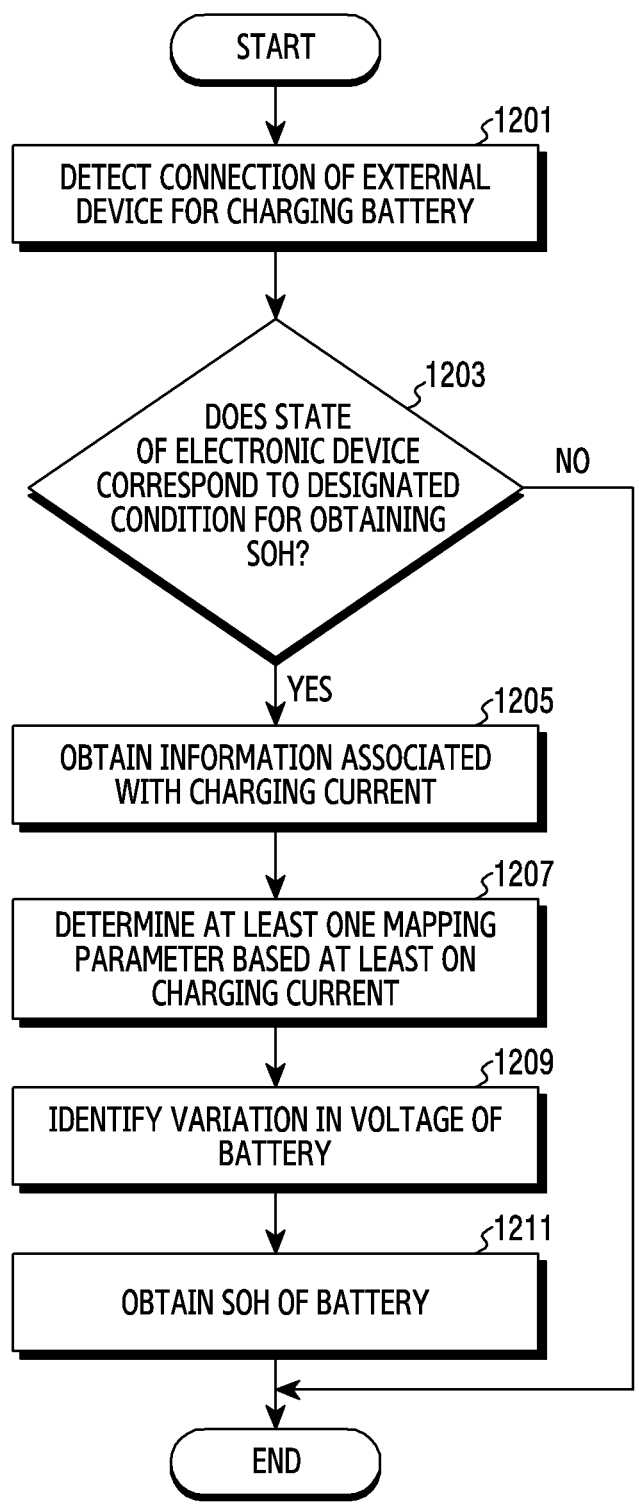
FIG. 12 is a flowchart illustrating a method of providing information associated with the state of a battery according to various embodiments of the disclosure.

FIG. 12 is a flowchart illustrating a method of providing information associated with the state of the battery 310 according to various embodiments of the disclosure.

Referring to FIG. 12, in operation 1201, according to an embodiment, the processor 320 may detect a connection of an external device for charging the battery 310.

Operation 1201 is at least partially the same as, or similar to, operation 901 of FIG. 9, and thus detailed descriptions thereof will be omitted.

In operation 1203, according to an embodiment, the processor 320 may determine whether the state of the electronic device 101 corresponds to a designated condition for obtaining the SOH (or SOC) of the battery 310.

According to an embodiment, while the battery 310 is being charged, if a function that consumes power greater than or equal to a designated threshold value is performed in the electronic device 101, the processor 320 may determine that the state does not correspond to (or does not satisfy) a designated condition for obtaining the SOH (or SOC) of the battery 310. For example, while the battery 310 is being charged, if an application (e.g., a navigation application, a game application, a video application, a call application, or the like) is running in the electronic device 101, the processor 320 may determine that the state does not correspond to a designated condition for obtaining the SOH (or SOC) of the battery 310. As another example, while the battery 310 is being charged, if the display device 160 is in the turned-on (turn-on) state in the electronic device 101, the processor 320 may determine that the state does not correspond to a designated condition for obtaining the SOH (or SOC) of the battery 310. In this instance, the case in which a function that consumes power greater than or equal to a designated threshold is performed in the electronic device 101, is not limited to the mentioned example.

In operation 1205, if the processor 320 determines that the state of the electronic device 101 corresponds to a designated condition for obtaining the SOH (or SOC) of the battery 310 in operation 1203, the processor 320, according to an embodiment, may obtain information associated with a charging current supplied via the external device.

In operation 1207, according to an embodiment, the processor 320 may determine at least one mapping parameter based at least on the charging current, from among the mapping parameters 331 stored in the memory 330.

In operation 1209, according to an embodiment, the processor 320 may identify a variation in output voltage (or output voltage level) of the battery 310 while the battery 310 is being charged via the external device.

In operation 1211, according to an embodiment, the processor 320 may obtain (or estimate) the SOH (or SOC) of the battery 310 based at least partially on the obtained mapping parameter 331 and the obtained variation in output voltage of the battery 310 (or the obtained variation in open circuit voltage of the battery 310).

Operations 1205 to 1211 are at least partially the same as, or similar to, operations 903 to 909 of FIG. 9, and thus detailed descriptions thereof will be omitted.

If the processor 320 determines that the state of the electronic device 101 does not correspond to a designated condition for obtaining the SOH (or SOC) of the battery 310 in operation 1203, the processor 320, according to an embodiment, may not perform an operation of obtaining the SOH (or SOC) of the battery 310 (or may continue the operation of charging the battery 310 without performing the operation of obtaining the SOH (or SOC) of the battery 310).

Figure 13:
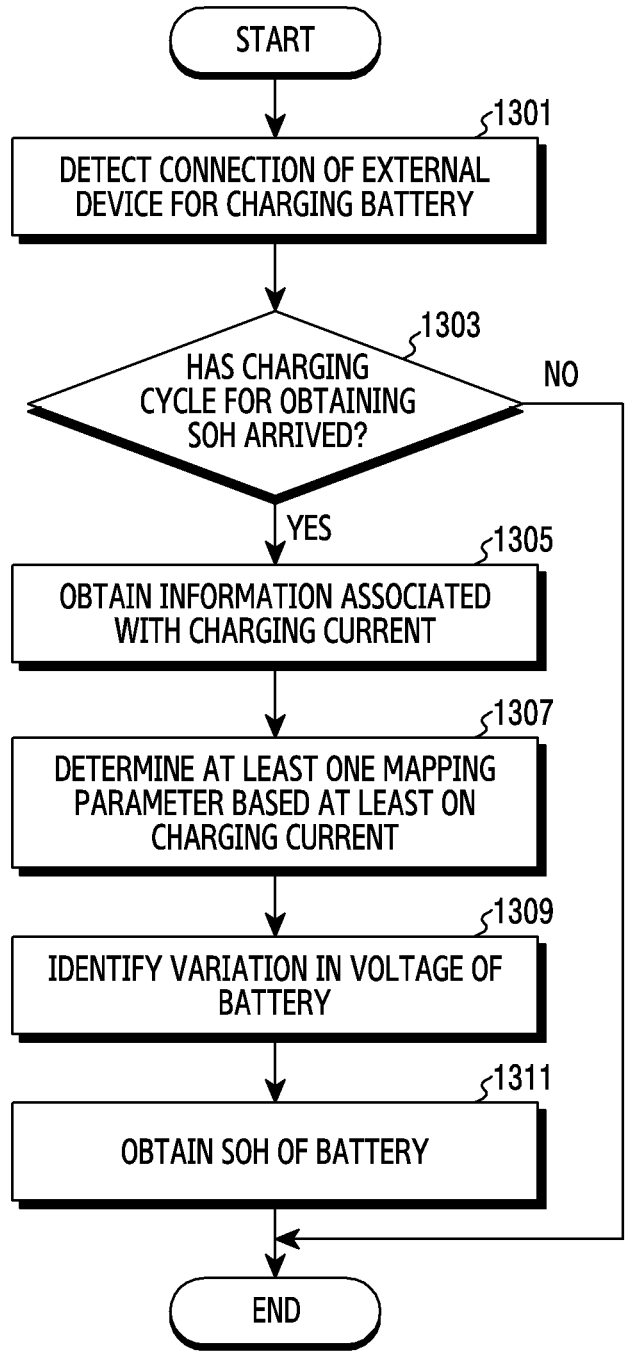
FIG. 13 is a flowchart illustrating a method of providing information associated with the state of a battery according to various embodiments of the disclosure.

FIG. 13 is a flowchart illustrating a method of providing information associated with the state of the battery 310 according to various embodiments of the disclosure.

Referring to FIG. 13, in operation 1301, according to an embodiment, the processor 320 may detect a connection of an external device for charging the battery 310.

Operation 1301 is at least partially the same as or similar to operation 901 of FIG. 9, and thus detailed descriptions thereof will be omitted.

In operation 1303, according to an embodiment, the processor 320 may identify whether a charging cycle (or cycle or period) for obtaining the SOH (or SOC) of the battery 310 has come (or has arrived).

According to an embodiment, the processor 320 may periodically obtain the SOH (or SOC) of the battery 310. For example, the processor 320 may perform an operation of obtaining the SOH (or SOC) of the battery 310 every a predetermined number of times of charging the battery 310 (e.g., every 50 charging times). As another example, the processor 320 may perform an operation of obtaining the SOH (or SOC) of the battery 310 at regular intervals (e.g., at intervals of a week) of charging the battery 310.

In operation 1305, if the processor 320 identifies that a charging cycle for obtaining the SOH (or SOC) of the battery 310 arrives in operation 1303, the processor 320, according to an embodiment, may obtain information associated with a charging current supplied via the external device.

In operation 1307, according to an embodiment, the processor 320 may determine at least one mapping parameter based at least on the charging current, from among the mapping parameters 331 stored in the memory 330.

In operation 1309, according to an embodiment, the processor 320 may identify a variation in output voltage (or output voltage level) of the battery 310 while the battery 310 is being charged via an external device.

In operation 1311, according to an embodiment, the processor 320 may obtain (or estimate) the SOH (or SOC) of the battery 310 based at least partially on the obtained (determined) mapping parameter 331 and the identified variation in output voltage of the battery 310 (or the identified variation in open circuit voltage of the battery 310).

Operations 1305 to 1311 are at least partially the same as, or similar to, operations 903 to 909 of FIG. 9, and thus detailed descriptions thereof will be omitted.

If the processor 320 identifies that a charging cycle for obtaining the SOH (or SOC) of the battery 310 arrives in operation 1303, the processor 320, according to an embodiment, may not perform an operation of obtaining the SOH (or SOC) of the battery 310 (or may continue the operation of charging the battery 310 without performing the operation of obtaining the SOH (or SOC) of the battery 310).

Figure 14:
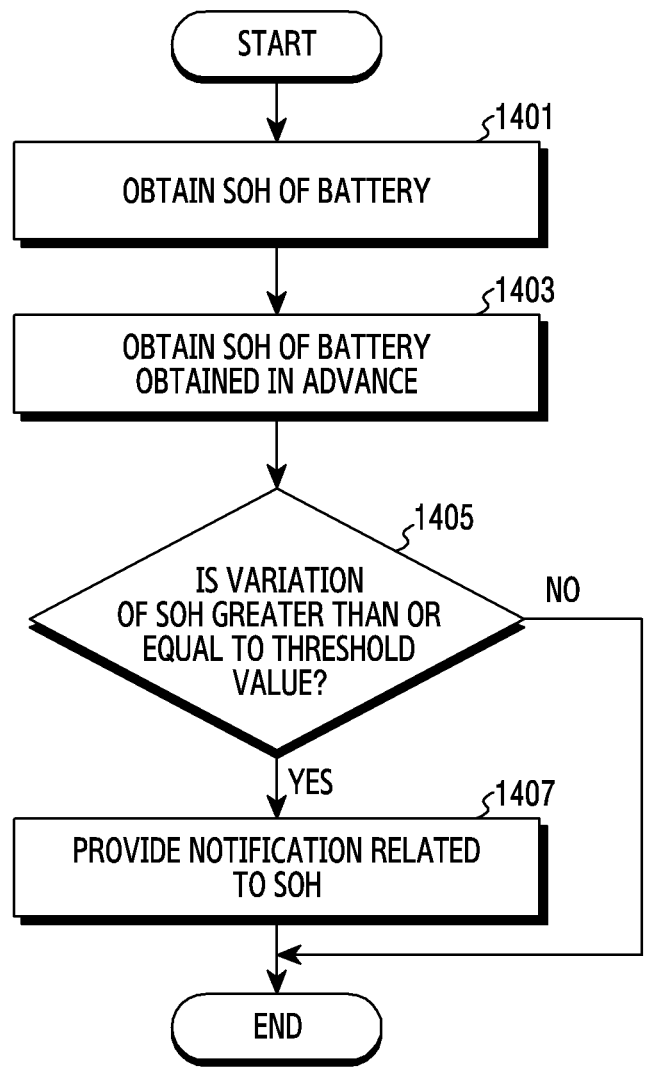
FIG. 14 is a flowchart illustrating a method of providing a notification associated with the state of a battery according to various embodiments of the disclosure.

FIG. 14 is a flowchart illustrating a method of providing a notification associated with the state of the battery 310 according to various embodiments of the disclosure.

Figure 15:
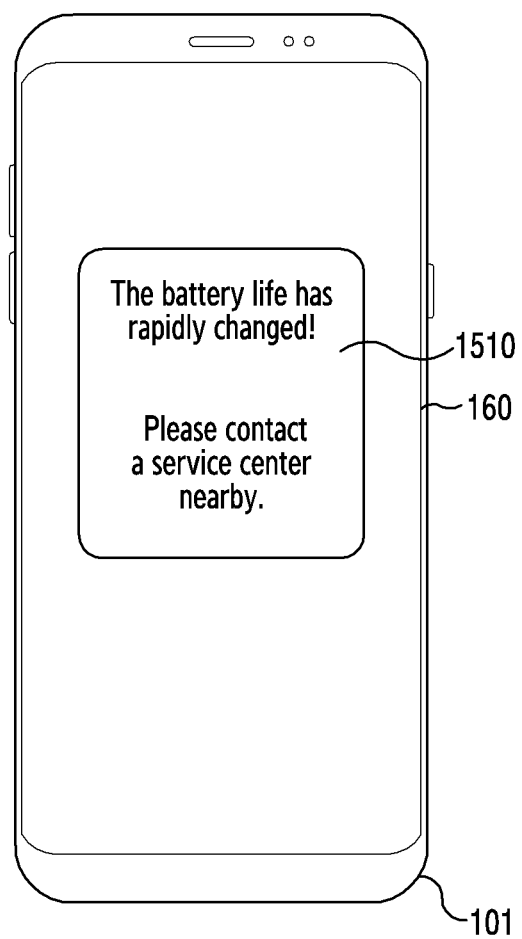
FIG. 15 is a diagram illustrating a method of providing a notification associated with the state of a battery according to various embodiments of the disclosure.

FIG. 15 is a diagram illustrating a method of providing a notification associated with the state of the battery 310 according to various embodiments of the disclosure.

Referring to FIGS. 14 and 15, in operation 1401, according to an embodiment, the processor 320 may obtain the SOH (or SOC) of a battery. For example, the processor 320 may obtain the current SOH (or SOC) of the battery 310 via the methods described with reference to FIGS. 9 to 13.

In operation 1403, the processor 320 may obtain (or identify) the SOH (or SOC) of the battery 310, which was obtained in advance. For example, the processor 320 may perform an operation of obtaining the SOH (or SOC) of the battery 310, and may store the obtained SOH (or SOC) of the battery 310 in the memory 330. From the memory 330, the processor 320 may obtain the SOH (or SOC) of the battery 310, which is obtained immediately before the current SOH (or SOC) of the battery 310 is obtained.

In operation 1405, the processor 320 may compare the current SOH (or SOC) of the battery 310 with the SOH (or SOC) of the battery 310 obtained in advance, and may identify whether a variation of the SOH (or SOC) of the battery 310 is greater than or equal to a designated threshold value. For example, the processor 320 may compare the current SOH (or SOC) of the battery 310 with the SOH (or SOC) of the battery 310 obtained in advance, and may identify whether the SOH (or SOC) of the battery 310 varies by at least approximately 1%. According to an embodiment, the designated threshold value may be set by a designer or a user of the electronic device 101 or the battery 310.

In operation 1407, if the processor 320 identifies that the SOH (or SOC) of the battery 310 varies by at least the designated threshold value, the processor 320 according to an embodiment may provide a notification related to the SOH (or SOC) of the battery 310. For example, the processor 320 may output the notification related to the change in the SOH (or SOC) of the battery 310 using at least one of the display device 160, the haptic module 179, or the sound output device 155. According to an embodiment, the notification related to the change of the SOH (or SOC) of the battery 310 may include a notification that informs the user of the electronic device 101 that the SOH (or SOC) of the battery 310 has varied by at least the designated threshold value, or a notification that enables a user to inform a service center related to the electronic device 101 or a manufacturer of the electronic device 101 (or the battery 310) that the SOH (or SOC) of the battery 310 has varied by at least the designated threshold value. For example, the processor 320 may output a message 1510 read as "The battery life has rapidly changed! Please contact a service center nearby." via a display, as illustrated in FIG. 15. According to an embodiment, the processor 320 may transmit a notification related to the change of the SOH (or SOC) of the battery 310 to a service center (or a device of a service center) related to the electronic device 101 or the manufacturer (or a manufacturer device) of the electronic device 101 (or the battery 310), using the communication module 190. In this instance, the method of providing the notification related to the change of the SOH (or SOC) of the battery 310 is not limited to the above-mentioned example.

In operation 1405, if the processor 320 identifies that the SOH (or SOC) of the battery 310 does not vary by at least the designated threshold value, the processor 320 may not provide a notification related to the SOH (or SOC) of the battery 310.

Figure 16:
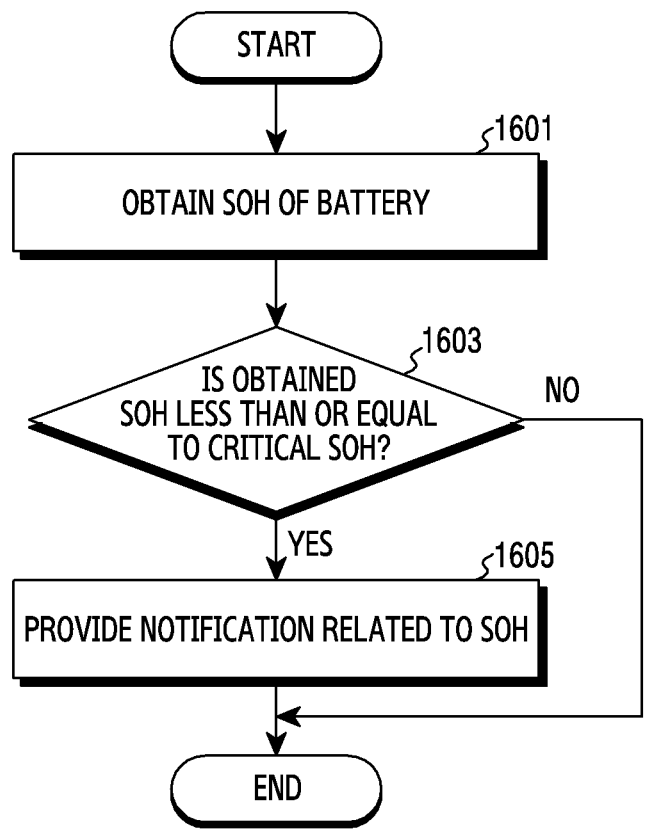
FIG. 16 is a flowchart illustrating a method of providing a notification associated with the state of a battery according to various embodiments of the disclosure.

FIG. 16 is a flowchart illustrating a method of providing a notification associated with the state of the battery 310 according to various embodiments of the disclosure.

Figure 17:
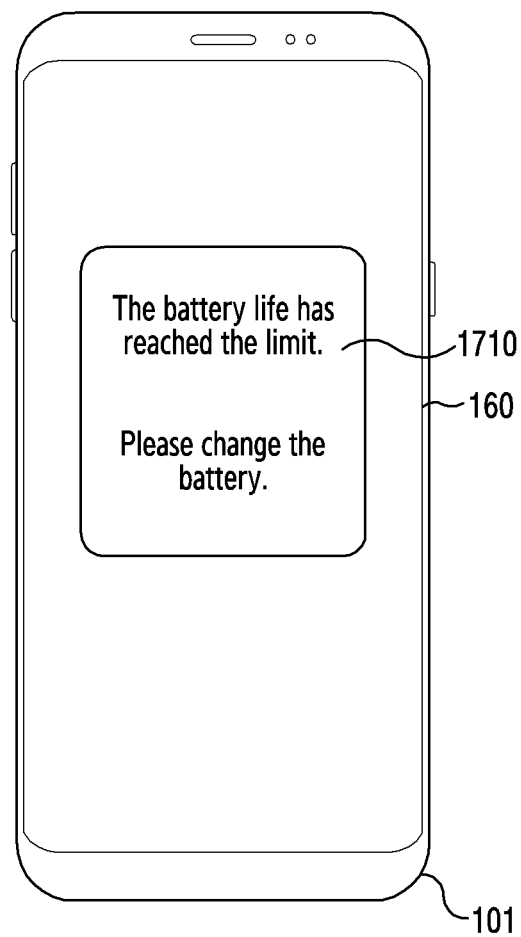
FIG. 17 is a diagram illustrating a method of providing a notification associated with the state of a battery according to various embodiments of the disclosure.

FIG. 17 is a diagram illustrating a method of providing a notification associated with the state of the battery 310 according to various embodiments of the disclosure.

Referring to FIGS. 16 and 17, in operation 1601, according to an embodiment, the processor 320 may obtain the SOH (or SOC) of the battery 310. For example, the processor 320 may obtain the current SOH of the battery 310 via the methods described with reference to FIGS. 9 to 13.

In operation 1603, the processor 320 may identify whether the obtained current SOH of the battery 310 is less than or equal to a critical SOH of the battery 310 (or reaches less than or equal to the critical SOH of the battery 310). According to an embodiment, the critical SOH of the battery 310 may be the SOH of the battery 310 that corresponds to the state in which the battery 310 deteriorates and is incapable of normally operating (or the state of a high probability of not being normally operated). According to an embodiment, the critical SOH of the battery 310 may be set by a designer (or manufacturer) of the electronic device 101 (or the battery 310).

In operation 1605, if the processor 320 identifies that the obtained current SOH of the battery 310 is less than or equal to the critical SOH of the battery 310, the processor 320, according to an embodiment, may provide a notification related to the SOH of the battery 310. For example, the processor 320 may output the notification indicating that the current SOH of the battery 310 reaches the critical SOH using at least one of the display device 160, the haptic module 179, or the sound output device 165.

According to an embodiment, the notification indicating that the current SOH of the battery 310 reaches the critical SOH may include a notification that informs the user of the electronic device 101 that the current SOH of the battery 310 has reached the critical SOH, or a notification that enables a user to inform a service center related to the electronic device 101 or a manufacturer of the electronic device 101 (or the battery 310) that the current SOH of the battery 310 has reached the critical SOH. For example, the processor 320 may output a message 1710 read as "The battery life has reached the limit! Please change the battery." via the display device 160, as illustrated in FIG. 17. According to an embodiment, the processor 320 may transmit a notification related to the fact that the current SOH of the battery 310 reaches the critical SOH to the service center (or a device of the service center) related to the electronic device 101 or the manufacturer (or a manufacturer device) of the electronic device 101 (or the battery 310), using the communication module 190. In this instance, the method of providing the notification related to the fact that the current SOH of the battery 310 reaches the critical SOH is not limited to the above-mentioned example.

In operation 1603, if the processor 320 identifies that the obtained current SOH of the battery 310 does not reach the critical SOH of the battery 310, the processor 320 may not provide a notification related to the SOH of the battery 310.

According to various embodiments of the disclosure, a method of obtaining the state of a battery of an electronic device, based on a variation in voltage of the battery during charging, may include: detecting that an external device for charging the battery is connected to the electronic device; charging the battery using a charging current supplied from the external device; determining, based at least on the charging current, at least one mapping parameter among one or more mapping parameters stored in a memory; identifying a variation in voltage of the battery while charging the battery; and obtaining the state of health (SOH) of the battery based at least on the at least one mapping parameter and the variation in voltage.

According to various embodiments, the memory may further include another mapping parameter which indicates a correlation between a variation in voltage of the battery and an SOC.

According to various embodiments, the variation in voltage of the battery includes a variation in a closed circuit voltage of the battery, and the one or more mapping parameters may include mapping parameters, which indicate a correlation between a variation in a closed circuit voltage of the battery and an SOH, and which are configured differently depending on a designated charging current.

According to various embodiments, the variation in voltage of the battery may include a variation in open circuit voltage of the battery, the one or more mapping parameters may include a mapping parameter indicating a correlation between a variation in an open circuit voltage of the battery and an SOH, and the operation of obtaining the variation in voltage of the battery may include obtaining the variation including the variation in the open circuit voltage of the battery, based at least on the charging current.

According to various embodiments, the one or more mapping parameters may include a mapping parameter indicating a correlation with an SOH in association with a temperature, and the method may further include: obtaining a temperature of the electronic device using a sensor module; and determining, based on the temperature, the at least one mapping parameter among the one or more mapping parameters.

According to various embodiments, the operation of obtaining the SOH of the battery may include: obtaining the SOH of the battery using a statistic estimation model based at least on the at least one mapping parameter and the variation in the voltage.

According to various embodiments, the operation of obtaining the SOH of the battery may include: obtaining the SOH of the battery using a machine learning scheme, based at least on the at least one mapping parameter and the variation in the voltage.

According to various embodiments, the method may further include: identifying whether the state of the electronic device corresponds to a designated condition for obtaining the SOH of the battery, and corresponds to a charging cycle for obtaining the SOH of the battery; and obtaining the SOH of the battery if the state of the electronic device is identified as corresponding to the designated condition for obtaining the SOH of the battery and as corresponding to the charging cycle for obtaining the SOH of the battery.

According to various embodiments, the operation of identifying the variation in voltage of the battery while the battery is being charged may include an operation of obtaining a variation in voltage based at least on a variation in voltage during a designated time while the battery is being charged.

According to various embodiments, the method may further include, after obtaining the SOH of the battery, an operation of comparing the obtained SOH of the battery with the SOH of the battery obtained in advance or a critical SOH, and if it is identified that the difference between the obtained SOH of the battery and the SOH of the battery obtained in advance is greater than or equal to a designated threshold value or the obtained SOH of the battery reaches the critical SOH, an operation of providing a notification related to the SOH of the battery.

In addition, the structure of data used in the above-described embodiments may be recorded in a computer readable recording medium via various means. The computer readable recording medium may include a storage medium such as a magnetic storage medium (e.g., a ROM, floppy disk, hard disk, or the like) and an optical reading medium (e.g., a CD-ROM, DVD, or the like).

According to an embodiment, the computer readable recording medium may record, in an electronic device, a program to implement operations in the electronic device, the operations including: detecting that an external device for charging the battery is connected to the electronic device; charging the battery using a charging current supplied from the external device; determining, based at least on the charging current, at least one mapping parameter among one or more mapping parameters stored in a memory; identifying a variation in voltage of the battery while charging the battery; and obtaining the state of health (SOH) of the battery based at least on the at least one mapping parameter and the variation in voltage.

The disclosure has been described with reference embodiments. It would be appreciated by those skilled in the art that changes may be made to these embodiments without departing from the principles and spirit of the disclosure. Therefore, the disclosed embodiments are provided for the purpose of describing the disclosure and the disclosure should not be construed as being limited to only the embodiments set forth herein. The scope of the disclosure is defined by the claims as opposed to by the above-mentioned descriptions, and it should be understood that disclosure includes all differences made within the equivalent scope.

The invention claimed is:

1. An electronic device, comprising:
a battery;
a memory storing one or more mapping parameters indicating a correlation between a variation in voltage of the battery and a state of health (SOH) of the battery for a plurality of charging currents; and
a processor,
wherein the processor is configured to:
detect that an external device for charging the battery is connected to the electronic device;
charge the battery using a charging current supplied from the external device, wherein the charging current is one of the plurality of charging currents, and determine, based at least on the charging current, at least one mapping parameter among the one or more mapping parameters for the one of the plurality of charging currents;
identify a variation in voltage of the battery while charging the battery; and
obtain an SOH of the battery based at least on the at least one mapping parameter and the variation in voltage.

2. The electronic device as claimed in claim 1, wherein the memory further comprises another mapping parameter which indicates a correlation between a variation in voltage of the battery and a state of charging (SOC) of the battery.

3. The electronic device as claimed in claim 1, wherein the variation in voltage of the battery includes a variation in closed circuit voltage of the battery, and the one or more mapping parameters comprise mapping parameters which indicate a correlation between a variation in closed circuit voltage of the battery and an SOH, and which are configured differently depending on the plurality of charging currents.

4. The electronic device as claimed in claim 1, wherein the variation in voltage of the battery includes a variation in open circuit voltage of the battery,
wherein the one or more mapping parameters comprise a mapping parameter indicating a correlation between the variation in open circuit voltage of the battery and an SOH, and
wherein the processor is configured to obtain, based at least on the charging current, the variation in voltage including the variation in open circuit voltage of the battery.

5. The electronic device as claimed in claim 1, wherein the one or more mapping parameters comprise a mapping parameter indicating a correlation with an SOH in association with a temperature, and
wherein the processor is configured to: obtain a temperature of the electronic device using a sensor module; and determine, based on the temperature, the at least one mapping parameter among the one or more mapping parameters.

6. The electronic device as claimed in claim 1, wherein the processor is configured to obtain the SOH of the battery using a statistic estimation model or a machine learning scheme, based at least on the at least one mapping parameter and the variation in voltage.

7. The electronic device as claimed in claim 1, wherein the processor is configured to:
identify whether a state of the electronic device corresponds to a designated condition for obtaining the SOH of the battery, and corresponds to a charging cycle for obtaining the SOH of the battery; and obtain the SOH of the battery if the state of the electronic device is identified as corresponding to the designated condition for obtaining the SOH of the battery, and is identified as corresponding to the charging cycle for obtaining the SOH of the battery.

8. The electronic device as claimed in claim 1, wherein the processor is configured to obtain the variation in voltage, based at least on a variation in voltage during a designated period of time in which the battery is being charged.

9. A method of obtaining a state of a battery of an electronic device, based on a variation in voltage of the battery during charging, the method comprising:
storing one or more mapping parameters indicating a correlation between a variation in voltage of the battery and a state of health (SOH) of the battery for a plurality of charging currents in a memory;
detecting that an external device for charging the battery is connected to the electronic device;
charging the battery using a charging current supplied from the external device, wherein the charging current is one of the plurality of charging currents;
determining, based at least on the charging current, at least one mapping parameter among the one or more mapping parameters stored in the memory for the one of the plurality of charging currents;
identifying a variation in voltage of the battery while charging the battery; and
obtaining a state of health (SOH) of the battery based at least on the at least one mapping parameter and the variation in voltage.

10. The method as claimed in claim 9, wherein the memory further comprises another mapping parameter which indicates a correlation between a variation in voltage of the battery and an SOC.

11. The method as claimed in claim 9, wherein the variation in voltage of the battery includes a variation in closed circuit voltage of the battery, and
wherein the one or more mapping parameters comprise mapping parameters, which indicate a correlation between a variation in closed circuit voltage of the battery and an SOH, and which are configured differently for the plurality of charging currents.

12. The method as claimed in claim 9, wherein the variation in voltage of the battery includes a variation in open circuit voltage of the battery,
wherein the one or more mapping parameters comprise a mapping parameter indicating a correlation between a variation in open circuit voltage of the battery and an SOH, and
wherein the obtaining of the variation in voltage of the battery comprises obtaining the variation including the variation in open circuit voltage of the battery, based at least on the charging current.

13. The method as claimed in claim 9, wherein the one or more mapping parameters comprise a mapping parameter indicating a correlation with an SOH in association with a temperature, and
wherein the method further comprises:
obtaining a temperature of the electronic device using a sensor module; and
determining, based on the temperature, the at least one mapping parameter among the one or more mapping parameters.

14. The method as claimed in claim 9, wherein the obtaining the SOH of the battery comprises:
obtaining the SOH of the battery using a statistic estimation model or a machine learning scheme, based at least on the at least one mapping parameter and the variation in the voltage.

15. The method as claimed in claim 9, further comprising:
identifying whether the state of the electronic device corresponds to a designated condition for obtaining the SOH of the battery, and corresponds to a charging cycle for obtaining the SOH of the battery; and
obtaining the SOH of the battery if the state of the electronic device is identified as corresponding to the designated condition for obtaining the SOH of the battery and as corresponding to the charging cycle for obtaining the SOH of the battery.

* * * * *